(12) United States Patent
Tanaka

(10) Patent No.: US 6,707,614 B2
(45) Date of Patent: Mar. 16, 2004

(54) LASER IRRADIATION STAGE, LASER IRRADIATION OPTICAL SYSTEM, LASER IRRADIATION APPARATUS, LASER IRRADIATION METHOD, AND METHOD OF MANUFACTURING A SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/170,739

(22) Filed: Jun. 14, 2002

(65) Prior Publication Data

US 2002/0191301 A1 Dec. 19, 2002

(30) Foreign Application Priority Data

Jun. 15, 2001 (JP) .................................... 2001-181065

(51) Int. Cl.[7] .............................................. G02B 27/10
(52) U.S. Cl. ........................ 359/626; 359/623; 359/621
(58) Field of Search ................................ 359/619, 618, 359/621, 623, 626; 117/103, 108; 438/150, 166

(56) References Cited

U.S. PATENT DOCUMENTS

| | | | |
|---|---|---|---|
| 5,643,826 A | 7/1997 | Ohtani et al. | |
| 5,858,822 A | 1/1999 | Yamazaki et al. | 438/166 |
| 6,077,731 A | * 6/2000 | Yamazaki et al. | 438/150 |
| 6,104,535 A | 8/2000 | Tanaka | |
| 6,137,633 A | 10/2000 | Tanaka | |
| 6,176,926 B1 | * 1/2001 | Tanaka | 117/92 |
| 6,246,524 B1 | 6/2001 | Tanaka | |
| 6,300,176 B1 | 10/2001 | Zhang et al. | |
| 6,304,385 B1 | 10/2001 | Tanaka | |

FOREIGN PATENT DOCUMENTS

JP 07-130652 A 5/1995

* cited by examiner

*Primary Examiner*—David N. Spector
(74) *Attorney, Agent, or Firm*—Nixon Peabody LLP; Jeffrey L. Costellia

(57) ABSTRACT

As the output of laser oscillators become higher, it becomes necessary to develop a longer linear shape beam for a process of laser annealing of a semiconductor film. However, if the length of the linear shape beam is from 300 to 1000 mm, or greater, then the optical path length of an optical system for forming the linear shape beam becomes very long, thereby increasing its footprint size. The present invention shortens the optical path length. In order to make the optical path length of the optical system as short as possible, and to increase only the length of the linear shape beam, curvature may be given to the semiconductor film in the longitudinal direction of the linear shape beam. For example, if the size of the linear shape beam is taken as 1 m×0.4 mm, then it is necessary for the optical path length of the optical system to be on the order of 10 m. If, however, the semiconductor film is given curvature with a radius of curvature of 40,000 mm, then the optical path length of the optical system can be halved to approximately 5 m, and a linear shape beam having an extremely uniform energy distribution can be obtained.

29 Claims, 19 Drawing Sheets

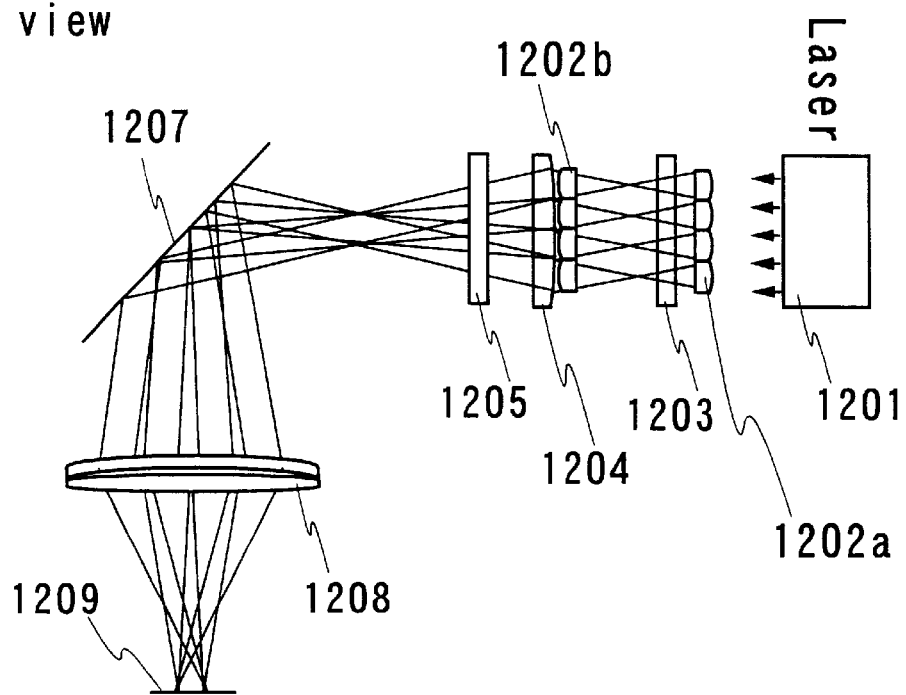
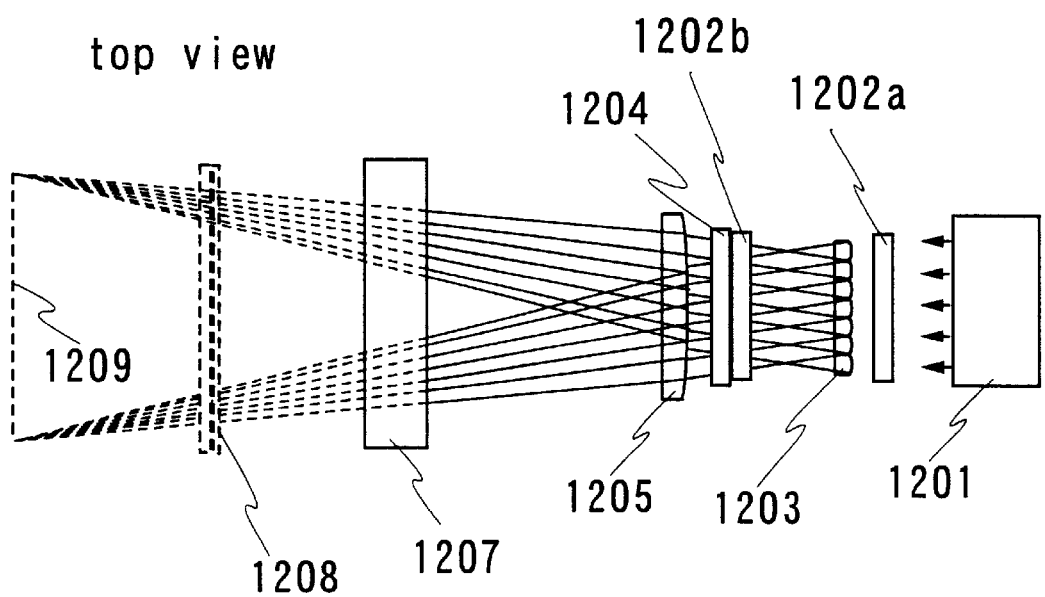
Fig. 2

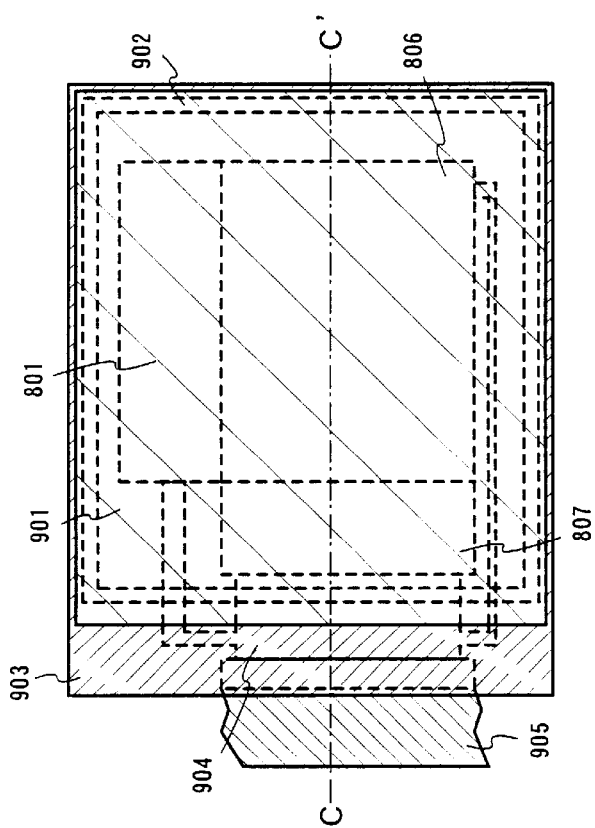
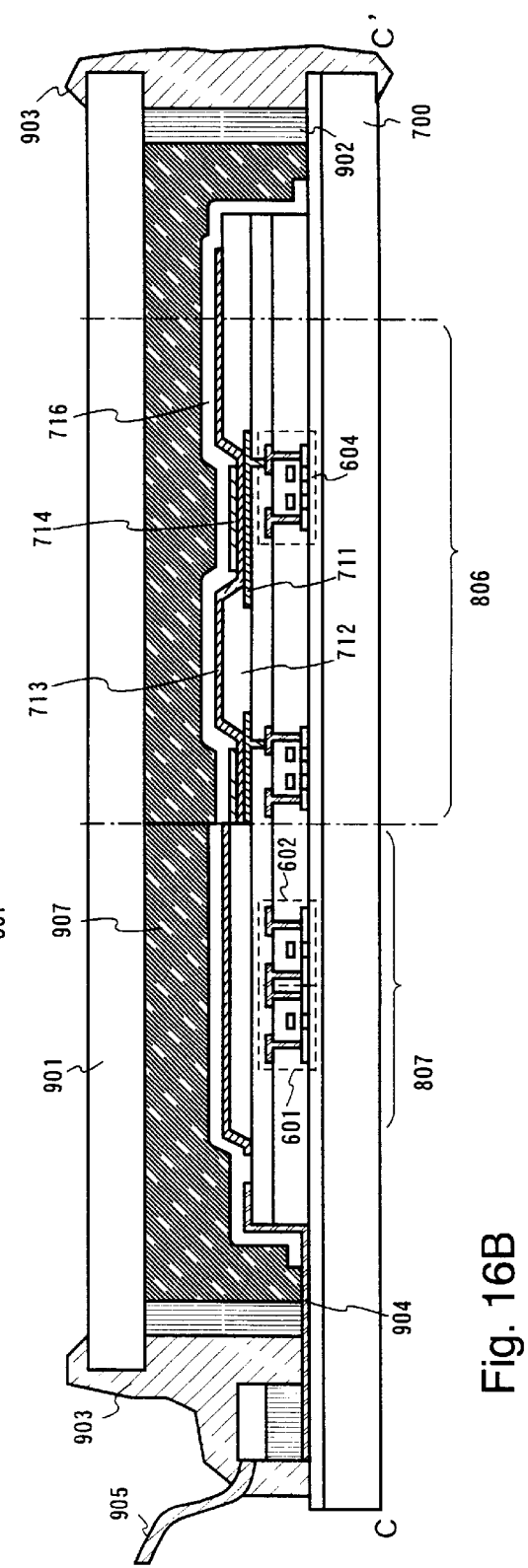
Fig. 16A
Fig. 16B

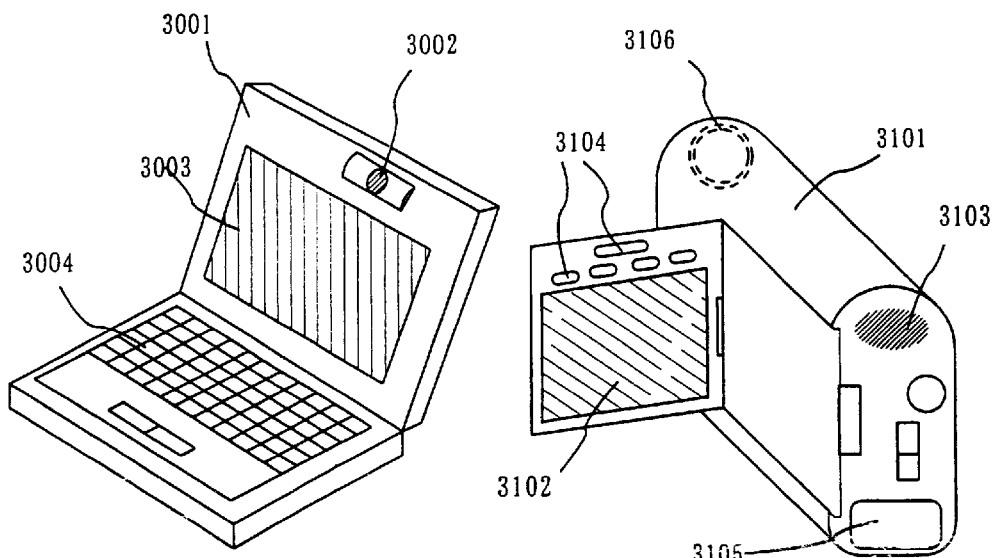
Fig. 17A
Fig. 17B
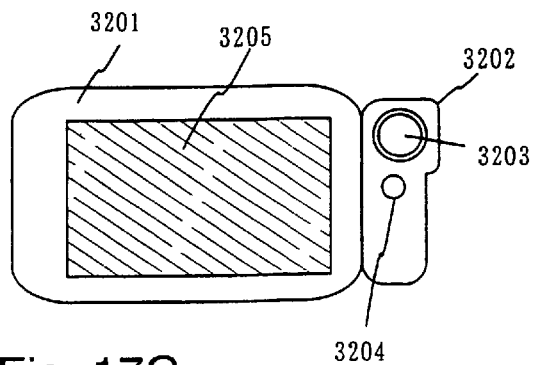
Fig. 17C
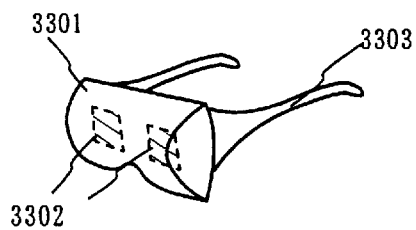
Fig. 17D
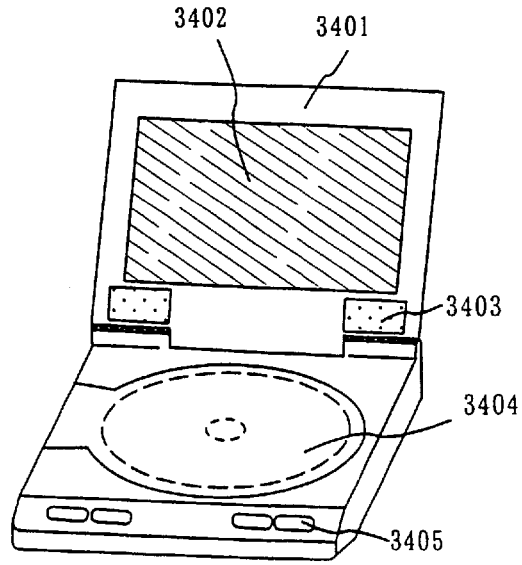
Fig. 17E
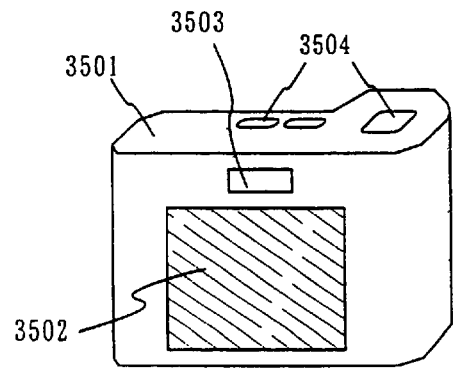
Fig. 17F

LASER IRRADIATION STAGE, LASER IRRADIATION OPTICAL SYSTEM, LASER IRRADIATION APPARATUS, LASER IRRADIATION METHOD, AND METHOD OF MANUFACTURING A SEMICONDUCTOR DEVICE

BACKGROUND OF THE INVENTION

1. Field of the Invention

The present invention relates to a stage for specifying a shape of an irradiation surface onto which a laser beam is irradiated. Further, the present invention relates to a laser irradiation apparatus in which energy distribution of a laser beam is made uniform over a certain specific region. The present invention also relates to a method of making an energy distribution uniform, and to an optical system to realize the uniformity. Furthermore, the present invention relates to a method of making the energy distribution of a laser beam uniform over a certain specified region, and to a method of annealing a semiconductor film using the laser beam (the method is hereafter referred to as "laser annealing"). The present invention also relates to a method of manufacturing a semiconductor device, the semiconductor device having circuits structured by thin film transistors (hereafter referred to as "TFTs"), which includes a laser annealing process. For example, electro-optical devices, typically liquid crystal display devices, and an electronic equipment in which such an electro-optical device is mounted as a part, are all included in the category of the semiconductor devices. Namely, the term "semiconductor device" as used throughout the specification indicates general devices capable of functioning by utilizing semiconductor device characteristics, and electro-optical devices, semiconductor circuits, and electronics all fall under the category of semiconductor devices.

2. Description of the Related Art

Techniques for performing crystallization, or for increasing crystallinity, by performing laser annealing of amorphous semiconductor films or crystalline semiconductor films (semiconductor films that are not single crystal, but have crystallinity such as poly-crystallinity or micro-crystallinity), in other words non-single crystal semiconductor films formed on an insulating substrate such as glass have been undergoing widespread research recently. Films such as silicon films are often used as the semiconductor films.

Glass substrate are low cost, and can be easily made into large surface area substrates, compared with conventional quartz substrates, which are often used. This is because the above research is actively performed. Lasers can impart a high energy to only a non-single crystal semiconductor film, without causing much change in the temperature of a substrate, and therefore lasers are suitable for annealing semiconductor films formed on the glass substrates having low melting point temperature (the distortion temperature of generally available glass substrate is on the order of 600° C.).

Crystalline semiconductor films formed by laser annealing have high mobility. The manufacture of TFTs on a single glass substrate, used for driving pixels and used in driver circuits, by using the crystalline semiconductor films is therefore flourishing, along with the manufacture of active matrix liquid crystal electro-optical devices. The crystalline semiconductor films are made from many crystal grains, and therefore they are also referred to as polycrystalline semiconductor films.

In laser annealing, a method in which a laser beam of a pulse oscillation type excimer laser or the like having high output is formed by an optical system so as to have a square shape spot of several cm/square, or a linear shape with a length equal to or greater than 10 cm, on an irradiation surface, and then scanning of the laser beam is performed (the irradiation position of the laser beam is made to move relative to the irradiation surface) is preferably used because it has good productivity and is industrially superior.

In particular, if a linear shape laser beam (hereafter referred to as a linear shape beam) is used, then the laser beam can be irradiated over the entire irradiation surface by scanning only in a direction perpendicular to the longitudinal direction of the linear shape beam. This differs from a case of using a spot shape laser bean, with which it is necessary to scan forward and backward, left and right, and therefore high productivity can be obtained. Scanning in a direction perpendicular to the longitudinal direction is performed because that scanning direction has the best efficiency. Due to their high efficiency, linear shape beams formed by appropriate optical systems are being used mainly in laser annealing processes. Note that, within this specification, the direction of the long side of the linear shape beam is referred to as a longitudinal direction, while the short side is referred to as a transverse direction.

An example of an optical system for forming the shape of a laser beam into a linear shape on an irradiation surface is illustrated. The optical system shown in FIG. 2 is an extremely general one. The optical system not only converts the shape of the laser beam into a linear shape on the irradiation surface, but at the same time it makes the energy distribution of the laser beam uniform. In general, optical systems for making the beam energy distribution more uniform are referred to as beam homogenizers. The optical system shown in FIG. 2 is one of beam homogenizers.

Synthetic quartz may be used in all cases, for example, as the base material of the optical light system, provided that an excimer laser to be an ultraviolet light is used as a light source. This is true because a high transmissivity can be obtained. Further, there may be employed a coating material capable of obtaining a transmissivity of 99% or more with respect to the wavelength of the excimer laser used as a coating.

The side view of FIG. 2 is explained first. A plane containing the light axis and parallel to the page of the side view is taken as a meridional plane, and a plane containing the light axis and perpendicular to the meridional plane is taken as a sagittal plane. The direction of the light axis changes here for cases in which it is necessary to bend the light path by using mirrors or the like due to the layout of the optical system, and it is assumed that the meridional plane and the sagittal plane also change at this time. A laser beam output from a laser oscillator 1201 is divided in a direction perpendicular to the sagittal plane by cylindrical lens arrays 1202a and 1202b. With this structure, there are four cylindrical lenses contained in the cylindrical lens array 1201, and therefore four divisions are made. It is assumed that the number of cylindrical lenses contained in the cylindrical lens array 1202b is also four. The divided laser beams are made to mutually overlap in a certain plane by a cylindrical lens 1204. It is not always necessary to use the two cylindrical lens arrays 1202a and 1202b; one cylindrical lens array may also be used. The advantages of using two cylindrical lens arrays are that the size of the linear shape beam can be changed, and that the width of the linear shape beam in the transverse direction can be made shorter.

The once again divided laser beams are bent at a right angle by a mirror 1207, and then made to once again overlap on an irradiation surface 1209 by using a doublet cylindrical lens 1208. The doublet cylindrical lens designates a lens structured by two cylindrical lenses. Uniformity of the energy distribution is thus formed in the transverse direction of the linear shape beam, and the width in the transverse direction of the linear shape beam is determined. The mirror 1207 is used in order to make the irradiation surface into a level surface, and is not always necessary.

The upper view of FIG. 2 is explained next. The laser beam emitted from the laser oscillator 1201 is divided in a direction perpendicular to the meridional plane by the cylindrical lens array 1203. There are seven lenses contained in the cylindrical lens array 1203 with this structure, and therefore the laser beam is divided into seven divisions. Two cylindrical lens arrays 1203 may also be used in order to change the length of the linear shape beam in the longitudinal direction. The laser beams are then made to overlap into one beam on the irradiation surface 1209 by a cylindrical lens 1205. Shown from the mirror 1207 forward by dashed lines are the correct light paths, and the positions of the lens and the irradiation surface, for a case in which the mirror 1207 is not disposed. Uniformity of the energy distribution in the longitudinal direction of the linear shape beam is thus formed, and the length of the linear shape beam in the longitudinal direction is determined.

The length L of the linear shape beam is determined by the following elements: a width d of the cylindrical lenses contained in the cylindrical lens array 1203; a focal length f1 of the cylindrical lenses; and a focal length f2 of the cylindrical lens 1205. This is explained while following FIG. 3. A cylindrical lens 1301 is structured by cylindrical lenses having a width d. A laser beam made incident to the cylindrical lens array 1301 is condensed into a plurality of positions by the location of the focal length f1. The laser beam then becomes incident to a cylindrical lens 1302 while expanding. The cylindrical lens 1302 is a convex lens, and therefore two parallel light fluxes within the figure are each concentrated at positions located at a distance f2 behind the cylindrical lens 1302. The distance f2 is the focal length of the cylindrical lens 1302. The laser beams that are each incident to the cylindrical lens array 1301 are thus converted to a linear shape beam having a length L. A simple calculation shows that:

$$(1) L = d \cdot f2/f1 \quad \text{Eq.(1)}$$

As explained above, the cylindrical lens array 1202a, the cylindrical lens array 1202b, and the cylindrical lens array 1203 function as lenses that divide the laser beam. The obtained uniformity of the laser beams is determined by the number of divisions. With the aforementioned structure, there are four divisions by seven divisions, and therefore a total of 28 divisions are formed.

By irradiating the linear shape beam thus formed in accordance with the above structure so as to be overlapped while gradually shifting the beam in the transverse direction, laser annealing can be performed with respect to the entire surface of a non-single crystal silicon film, for example, and the crystallization can be achieved and the crystallinity of the film can be increased.

The shape of laser beams emitted from excimer lasers is generally rectangular, falling with an aspect ratio range of approximately one to five. The laser beam strength shows a Gaussian distribution in which it becomes stronger toward the center. The size of the laser beam can be converted, for example, into a uniform energy distribution 300 mm×0.4 mm linear shape beam by the optical system shown in FIG. 2.

According to an experiment performed by the applicants of the present invention, the overlap pitch is most suitably set to approximately 1/10th of the width of the linear shape beam in the transverse direction when irradiating a linear shape beam of pulse oscillation with respect to a semiconductor film. Namely, if the width in the transverse direction of the linear shape beam is 0.4 mm, then laser annealing may be performed while shifting the semiconductor film in the transverse direction of the linear shape beam by 0.04 mm during the time from one pulse of light is emitted until the next pulse of light is emitted. The uniformity of laser annealing of the semiconductor film is thus increased. The method discussed thus far is an extremely general method used in order to perform laser annealing of a semiconductor film by using a linear shape beam.

The increasingly high output of laser oscillators has been remarkable recently, and laser oscillators capable of having a linear shape beam length exceeding 300 mm have become available. However, the substrate size used in production plants has also changed, and 600 mm×720 mm substrates, and 1000×1200 mm substrate are now planned, for example. A length on the order of 300 mm for the linear shape beam is becoming insufficient. If a case of annealing a semiconductor film formed on a 600 mm×720 mm substrate, for example, using a 300 mm long linear shape beam is considered, the longitudinal direction of the linear shape beam and the short side (the side having a length of 600 mm) of the substrate may be disposed in parallel. Half of the substrate surface can be laser annealed by scanning relatively the substrate with respect to the linear shape beam over a distance of 720 mm with in the direction of the long side of the substrate. Provided that the remaining half surface then undergoes laser annealing by the similar method, the entire surface of the substrate can be laser annealed.

There is exerted a bad influence on the throughput and on the footprint if laser annealing is performed by this type of method, namely scanning of the substrate (or the linear shape beam) must be performed two or more times, and the substrate (or the linear shape beam) must be moved forward and backward, and left and right. Furthermore, if laser annealing is performed on one half of the substrate at the time using the linear shape beam, then one half of the semiconductor film is laser annealed uniformly. However, uniformity is lost in the vicinity of the boundary between the one and the other half of the semiconductor film, and it is difficult to form semiconductor elements in this portion. Looking at these problem points, it becomes clear that it is preferable to make the length of the linear shape beam in the longitudinal direction at least on the same order as the length of the short side of the substrate.

However, there is a tendency for the path length of the optical system to become longer in order to form a long linear shape beam. For example, an optical path length on the order of 5000 mm is necessary to make a 300 mm long linear shape beam, further the optical path length will exceed 10,000 mm in order to make a 1000 mm long linear shape beam.

SUMMARY OF THE INVENTION

An object of the present invention is to determine what type of optical system is necessary in forming a very long linear shape beam, and what type of laser irradiation apparatus may be manufactured, to prepare the future when a high output laser oscillator is put into a practical use. Further, an object of the present invention is to provide a laser irradiation apparatus having a very small footprint.

A laser beam having a uniform energy distribution on a substrate is formed by forming a substrate into a shape having curvature (at least one curvature). In other words, the essence of the present invention is that the focus position of a linear shape beam is adjusted by providing cylindrical shape curvature to a substrate, and a substrate, in particular a large surface area substrate, is laser annealed by a linear shape beam allowing an extremely uniform energy distribution. Large surface area substrates bend very easily, and therefore it is possible to easily form the curvature necessary for the present invention. Many types of processes can be performed by using the laser beam, such as crystallization of semiconductor films, and activation of impurity elements.

Further, with employment of the present invention, it is also possible to make the optical path length of an optical system for forming a conventional linear shape beam, or for forming a linear shape beam shorter than a conventional beam, shorter than the optical path length of a conventional optical system. In this case, the substrate becomes relatively small, and therefore curvature can be easily given to the substrate if a flexible substrate or the like is used instead of a hard substrate such as a glass substrate. It is therefore preferable to use a flexible substrate.

The structure of the present invention relating to a laser irradiation stage is that an irradiation surface for a beam expanded in a single direction has a shape having curvature in a direction parallel to the single direction.

Further, the structure of the present invention relating to a laser irradiation optical system has a first means for expanding a beam in a single direction, and a second means for establishing an irradiation surface for the beam expanded in the single direction. The second means gives the irradiation surface a shape having curvature in a direction parallel to the single direction.

In the aforementioned structure, the first means or the second means contains a cylindrical lens array or a cylindrical lens. The cylindrical lens array can expand a laser beam in a single direction, make the beam uniform, or perform both actions. Further, the cylindrical lens can concentrate a laser beam in a single direction. A laser beam can be expanded, made uniform, and condensed in a single direction by combining the two types of lenses, and a laser beam can be expanded, made uniform, and condensed in each of two orthogonal directions by disposing the two types of lenses at right angles to each other.

Further, the structure of the present invention relating to a laser irradiation apparatus has a laser oscillator, a first means for expanding a laser beam emitted from the laser oscillator in a first direction, a second means for condensing the laser beam in a second direction orthogonal to the first direction, and a third means for establishing an irradiation surface and for moving the irradiation surface relative to the laser beam in the second direction. The third means gives the irradiation surface a shape having curvature in a direction parallel to the first direction.

In the above structure, it is preferable that the laser oscillator combined with the present invention have high output in a wavelength region that is well absorbed by semiconductor films. If a silicon film is used as a semiconductor film, then it is preferable that, considering the absorption index, the wavelength of the laser beam emitted from the laser oscillator used be equal to or less than 600 nm. Excimer lasers, YAG lasers (higher harmonic waves) and glass lasers (higher harmonic waves) may be used, for example, as laser oscillators for emitting this type of laser beam.

Further, lasers such as $YVO_4$ lasers (higher harmonic waves), YLF lasers (higher harmonic waves), $YAlO_3$ lasers, glass lasers, ruby lasers, alexandrite lasers, Ti:sapphire lasers, Ar lasers, Kr lasers, $CO_2$ lasers, helium cadmium lasers, copper vapor lasers and metallic vapor lasers may be used, for example, as laser oscillators with wavelengths suitable for crystallization of a silicon film. In addition, continuous oscillation type laser oscillators can be applied to the present invention.

In the above structure, the first means or the second means contains a cylindrical lens array or a cylindrical lens.

The structure of the present invention relates to a method of laser irradiation including expanding a laser beam emitted form a laser oscillator in a first direction; condensing the laser beam in a second direction orthogonal to the first direction; and irradiating the laser beam to an irradiation surface while moving the laser beam relative to the irradiation surface in the second direction. The irradiation surface has a shape having curvature in a direction parallel to the first direction.

In the aforementioned structure, it is preferable that the wavelength of the laser beam emitted form the laser oscillator be equal to or less than 600 nm. Excimer lasers, YAG lasers (higher harmonic waves), and glass lasers (higher harmonic waves) can be used, for example, as laser oscillators that emit the above-mentioned laser beam. Further, lasers such as $YVO_4$ lasers (higher harmonic waves), YLF lasers (higher harmonic waves), $YAlO_3$ lasers, glass lasers, ruby lasers, alexandrite lasers, Ti:sapphire lasers, Ar lasers, Kr lasers, $CO_2$ lasers, helium cadmium lasers, copper vapor lasers, and metallic vapor lasers may be used, for example. In addition, continuous oscillation type laser oscillators can be applied to the present invention, besides the pulse oscillation type lasers.

Further, the structure of the present invention relates to a method of manufacturing a semiconductor device including: expanding a laser beam emitted from a laser oscillator in a first direction; condensing the laser beam in a second direction orthogonal to the first direction; and irradiating the laser beam to a semiconductor film while moving the laser beam relative to the semiconductor film in the second direction, thereby performing annealing of the semiconductor film. The semiconductor film is established in a shape having curvature in a direction parallel to the first direction.

It is preferable that the wavelength of the laser beam emitted form the laser oscillator be equal to or less than 600 nm in the above-stated structure. Excimer lasers, YAG lasers (higher harmonic waves), and glass lasers (higher harmonic waves) can be used, for example, as laser oscillators that emit the above-mentioned laser beam. Further, lasers such as $YVO_4$ lasers (higher harmonic waves), YLF lasers (higher harmonic waves), $YAlO_3$ lasers, glass lasers, ruby lasers, alexandrite lasers, Ti:sapphire lasers, Ar lasers, Kr lasers, $CO_2$ lasers, helium cadmium lasers, copper vapor lasers, and metallic vapor lasers may be used, for example. In addition, continuous oscillation type laser oscillators can be applied to the present invention, besides the pulse oscillation type lasers.

It becomes possible to form a very long laser beam (in particular, a linear shape beam) having uniformity on an irradiation surface by applying the present invention. In addition, an optical system for forming this type of laser beam is a laser irradiation apparatus having a small footprint, and therefore is not made large in size. The optical system is particularly effective when set in a clean room having high cost per unit surface area. The characteristics of semiconductor films manufactured using this type of laser beam become uniform, and the electrical characteristics of TFTs, and by extension, the operating characteristics of semiconductor devices, are both improved. A reduction in cost of the semiconductor device can also be achieved.

BRIEF DESCRIPTION OF THE DRAWINGS

In the accompanying drawings:

FIG. 2 is a diagram for explaining a conventional optical system;

FIGS. 16A and 16B are an upper view of a light emitting device, and a cross sectional diagram of a driver circuit and a pixel portion of the light emitting device, respectively;

FIGS. 17A to 17F are diagrams illustrating examples of semiconductor devices;

DETAILED DESCRIPTION OF THE PREFERRED EMBODIMENTS

Embodiment Mode

An embodiment mode of the present invention will be explained with reference to FIGS. 5A and 5B.

Figure 5A:
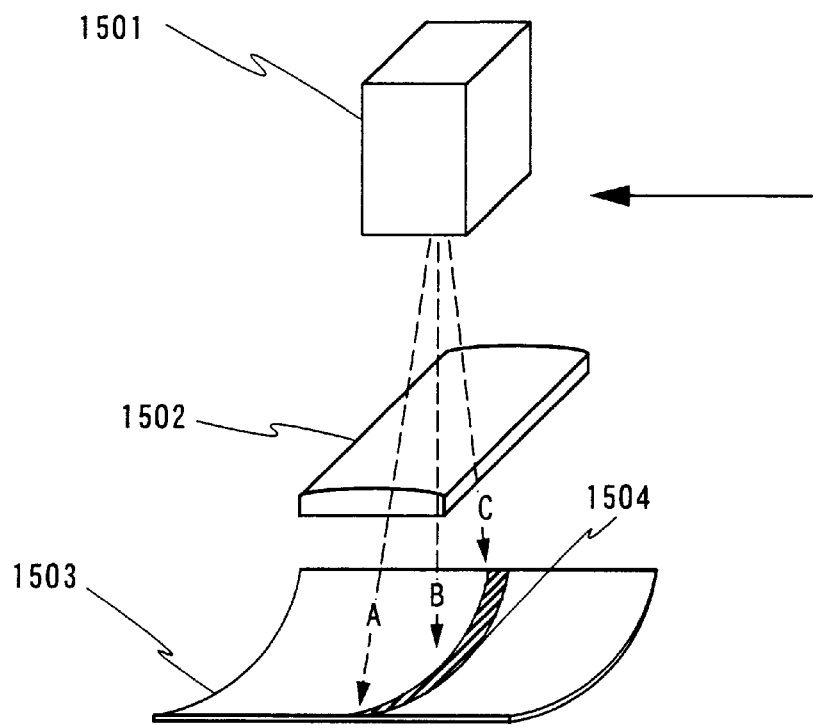
FIGS. 5A and 5B are diagrams showing the focus position of a linear shape beam.

FIGS. 5A and B show a simple view of the positional relationship between the curvature direction of a substrate and an optical system. In FIG. 5A, reference numeral 1501 denotes an optical system for expanding a laser beam in one direction, and a laser beam (illustrated within the figures by dashed lines having arrowheads A, B, and C) that has been expanded by the optical system 1501 is formed into a thin linear shape by a cylindrical lens 1502. A substrate 1503 has curvature in the longitudinal direction of the linear shape beam such that the nearer to the edge of the substrate 1503, the shorter the distance from the substrate 1503 to the cylindrical lens 1502 becomes. In other words, the curvature is preferably provided in a negative direction with respect to the direction that the laser beam advances; namely, the center of the radius of curvature is formed at a position from the substrate on the side of a laser oscillator. A linear shape beam 1504 thus is formed along the curvature of the substrate. The applicants of the present invention performed a simulation that determined that a radius of curvature on the order of 10,000 to 100,000 mm is suitable. The curvature is changed into a numerical value by the term "radius of curvature" in this specification in order to make its expression easier, but the curvature is gentle, and therefore it is not always necessary that the substrate be on a completely round circle. The radius of curvature depends greatly on the structure of the optical system, and therefore it is necessary to decide on the radius of curvature in concert with the design of the optical system. The height difference between the substrate edge and the substrate center is extremely gentle at several mm when forming curvature having a radius of curvature of several ten thousands of mm, and therefore it is possible to form this curvature without placing any load on the substrate. The substrate has normally a thickness on the order of 1 mm or less, and it becomes more easy to form curvature the larger the surface area of the substrate. Methods such as a method of placing the substrate on a stage already having curvature, and a method of supporting the substrate by pins, and increasing the pin height toward the edges of the substrate can be considered for providing curvature. Further, if height of each of pins is freely changed, operators freely set a size of curvature at arbitrary point of the substrate. It is possible to very easily form curvature, no matter which method is employed.

Figure 5B:
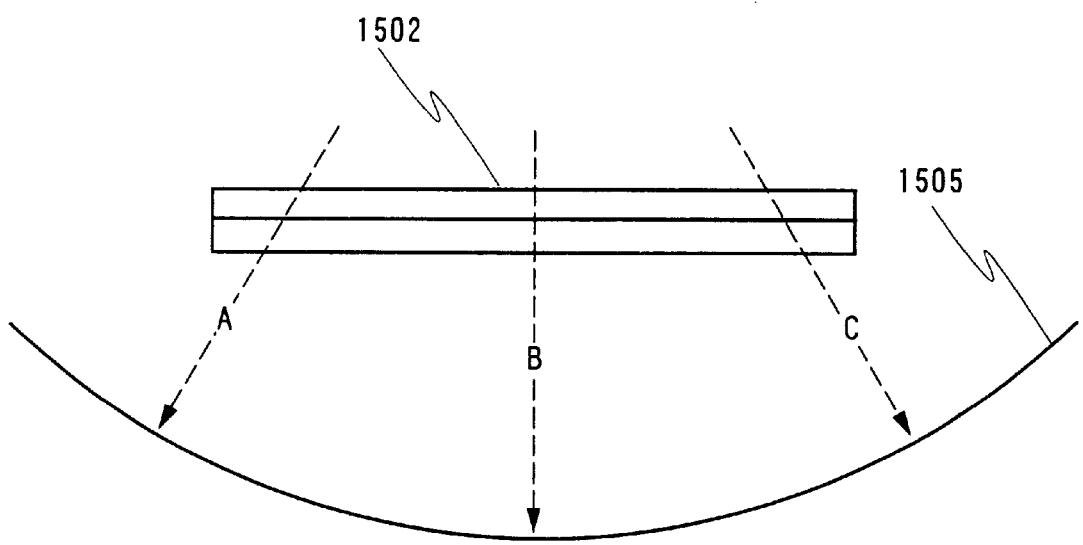

The focus position of the cylindrical lens 1502 is explained according to FIG. 5B. FIG. 5B is a diagram viewed from the direction of the arrows of FIG. 5A. The aggregation of focus positions (laser beam focal point positions due to the cylindrical lens 1502) of the incident laser beam expanded by the cylindrical lens 1502 have curvature along a curved line 1505. That is, laser beams incident to the cylindrical lens 1502 with focal positions on a diagonal, such as the laser beam A and C, will have a focus position that shifts upward (to the side of the cylindrical lens 1502), as compared with laser beams incident to the cylindrical lens 1502 from straight on, like the laser beam B. The present invention corrects the shifts. The shifts in focus position occur when changing the shape of a rectangular shape beam having an extremely uniform energy distribution into a linear beam, and therefore the present invention can also be applied in an optical system for forming only a linear shape beam from a beam having a uniform energy distribution.

It thus becomes possible with the present invention to correct the shift in the laser beam focus on an irradiation surface by giving curvature to the substrate. In addition, the optical path length of an optical system for forming a laser beam having a predetermined shape (for example, a linear shape beam) in the irradiation surface can be made shorter with the present invention. The footprint of a laser irradiation apparatus having this type of optical system becomes smaller, and therefore the present invention is particularly effective when set in a clean room having an extremely high unit price per surface area.

EMBODIMENTS

Embodiment 1

Figure 1:
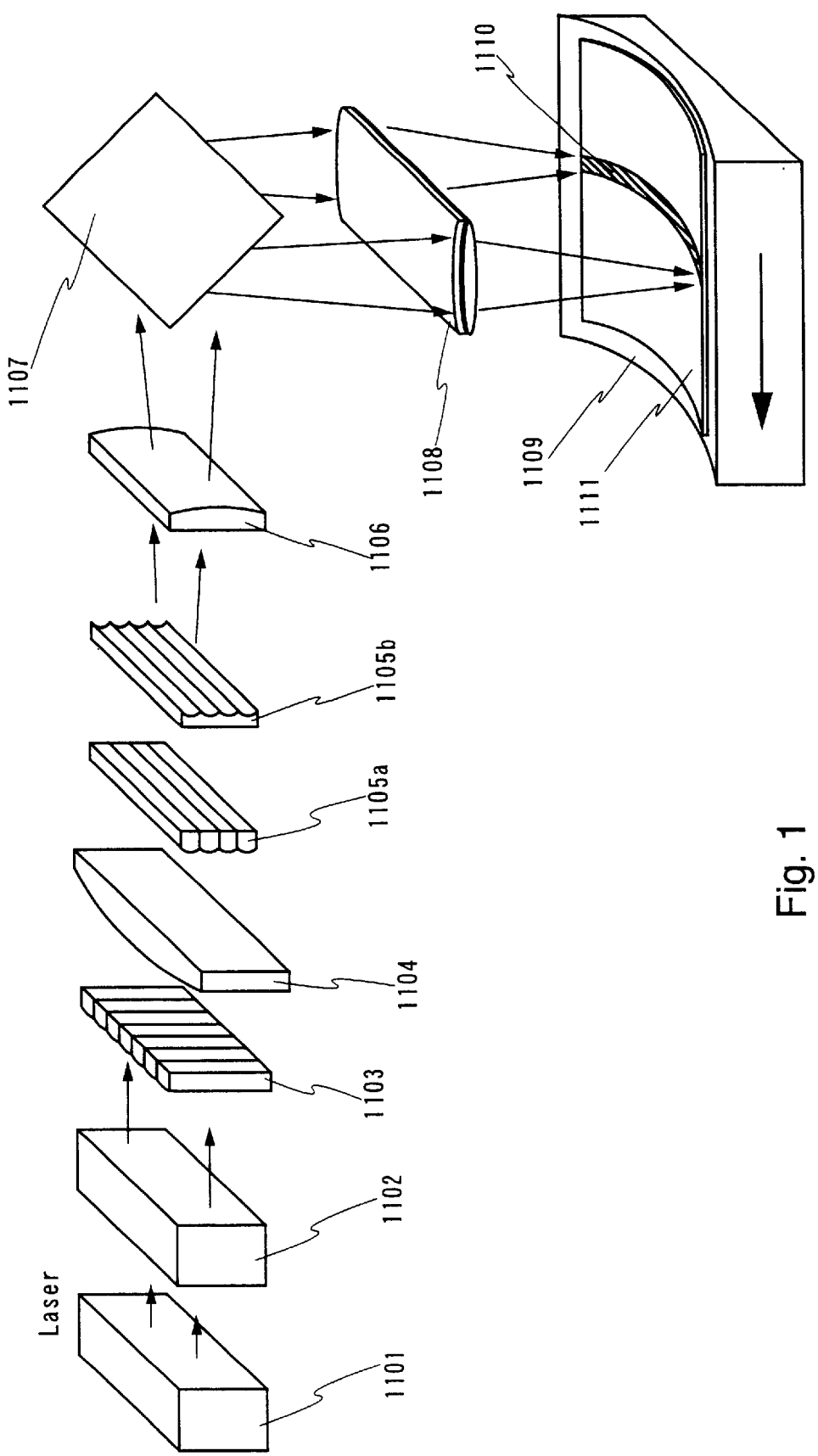
FIG. 1 is a diagram for explaining an embodiment mode.

An embodiment of the present invention is explained using FIG. 1.

First, a 1000 mm×1200 mm×0.7 mm glass substrate is prepared. An insulating film is formed on one surface of the glass substrate by a known method (such as sputtering, plasma CVD, or reduced pressure CVD). Substrates made from glass such as barium borosilicate glass or aluminum borosilicate glass can be given as examples of the glass substrate. The insulating film may be formed using a silicon oxide film or the like, with a film thickness on the order of 200 nm. The insulating film functions as a blocking layer such that substances such as alkaline metal harmful to a semiconductor device do not incur upon the amorphous silicon film from the glass substrate. Note that quartz substrates, silicon substrates, plastic substrates, metallic substrates, stainless steel substrates, flexible substrates, and the like can also be used in addition to glass substrates. Further, flexible substrates having a film shape and made from materials such as PET, PES, PEN, or acrylic. Using a flexible substrate, lighter weight can be anticipated provided that a semiconductor device is manufactured. The durability of a flexible substrate can be increased provided that a single layer, or multiple layer, of barrier layer made from an aluminum film (such as AlON, AlN, or AlO), a carbon film (such as DLC (diamond like carbon)), SiN, or the like is formed on the front surface, or the front and rear surfaces, of the flexible substrate. It is therefore preferable to form such a barrier layer.

A non-single crystal semiconductor film is then formed on the insulating film by using a known method. An amorphous silicon film is formed having a thickness of 55 nm as the non-single crystal semiconductor in embodiment 1. Note that it can be easily projected that the present invention can also be applied to other non-single crystal semiconductors. For example, a compound semiconductor film having an amorphous structure, such as an amorphous silicon germanium film, may also be used as the non-single crystal semiconductor. Alternatively, a polycrystalline silicon film may also be used as the non-single crystal semiconductor, as shown in an example of a manufacturing method in a later embodiment.

The substrate on which the non-single crystal semiconductor is formed is then subjected to heat treatment for one hour at 450° C. in a nitrogen atmosphere. This process is performed for reducing the concentration of hydrogen within the amorphous silicon film. If the amount of hydrogen within the film is too large, then the film cannot endure the energy of a laser, and therefore this process is performed. A concentration on the order of $10^{20}/cm^3$ is suitable for the hydrogen concentration within the film. The value "$10^{20}/cm^3$" as used here denotes that $10^{20}$ hydrogen atoms exist per 1 $cm^3$ of the film. It is also possible to perform this process in a very short period of time by an RTA (rapid thermal annealing) process. The optimal conditions for the RTA process differ greatly in accordance with the light source and processing method used, and therefore the conditions must be suitably determined by the operator.

The process is performed using a pulse oscillation XeCl excimer laser having an oscillation wavelength of 308 nm as a laser oscillator in embodiment 1, for example. If the maximum output of the excimer laser is on the order of 3 J per pulse, then it is possible to sufficiently crystallize the amorphous silicon film by forming a 1000 mm×0.4 mm linear shape beam.

An example of a laser irradiation apparatus used in embodiment 1 is illustrated in FIG. 1. A laser beam emitted from a laser oscillator 1101 is converted into a predetermined shape by a beam expander 1102 before being incident to an optical system. The beam expander uses normally a Galileo type telescope, and the energy concentration of the laser beam is thus reduced, making the load on the optical system smaller, alternatively, may also function as a role that optimizes the shape of the laser beam made incident to the optical system. That is, if a laser beam having a spot that is very small is made incident to the optical system, then the number of divisions of the laser beam becomes fewer, and the level of energy distribution uniformity drops. On the other hand, if a laser beam having a very large spot size is made incident to the optical system, then the effective diameter of the optical system will be exceeded, and an energy loss will occur. The beam expander magnification may be determined by considering the above issues. The beam expander may be formed by using a cylindrical lens, and may also be formed by using spherical lenses. When it is desired to expand a laser beam by same magnification in the vertical and horizontal directions, it may be formed by spherical lenses, however, when the above is conducted by different magnification, it is formed by cylindrical lenses. If it is desired to expand a laser beam by different magnification factors in the vertical and horizontal directions, then two beam expanders structured by cylindrical lenses may be used. The size of the laser beam emitted from the laser oscillator is set to 13×35 mm in embodiment 1. This size is for a typical high output excimer laser. In order to decrease the energy concentration of the laser beam as much as possible, the beam is expanded by a magnification of 1.8 times, for example, by using a beam expander structured by a spherical lens. Namely, the laser beam size becomes 23 mm×63 mm. In this optical system, a plane parallel to the width (23 mm) of the transverse direction of the laser beam containing the light axis of the laser beam is defined as a meridional plane, and a plane parallel to the length (63 mm) of the longitudinal direction containing the light axis of the laser beam is defined as a sagittal plane. Note that, for cases in which a mirror is placed within the optical path, it is assumed that the meridional plane and the sagittal plane each change in accordance with changes in the optical path due to the mirror.

The laser beam, converted into a desired magnification by the beam expander 1102, is then made incident upon a cylindrical lens array 1103. Cylindrical lenses structuring the cylindrical lens array 1103 are planoconvex lenses having a length of 60 mm, a width of 2 mm, a thickness of 5 mm, and a radius of curvature equal to 4 mm. If the laser beam is made incident from a convex plane, then the refraction power is scattered preferably. Note that the radius of curvature is taken as always provided in the transverse direction within this specification. Thirty five of the cylindrical lenses are lined up in an array, forming the cylindrical lens array 1103 with dimensions of 60 mm×70 mm×5 mm. Note that, for simplicity, 7 cylindrical lenses are illustrated in FIG. 1. The transverse direction of the cylindrical lens array 1103 is placed parallel to the sagittal plane. The laser beam is thus divided into a plurality of beams, and each of the beams is greatly expanded.

The laser beam exits the cylindrical lens array 1103, passes through a space of 120 mm, and is made incident to a cylindrical lens 1104. The cylindrical lens 1104 is a planoconvex lens having a length of 60 mm, a width of 150 mm, a thickness of 20 mm, and a radius of curvature equal to 2140 mm. The laser beam is made incident from the convex surface. The transverse direction and the sagittal plane are disposed in parallel. The laser beams divided by the cylindrical lens array 1103 are thus made to mutually overlap in a certain plane. The combination of the cylindrical lens array 1103 and the cylindrical lens 1104 is similar to the optical system explained by FIG. 3.

The laser beam emitted from the cylindrical lens 1104 is made incident to a cylindrical lens array 1105a after passing through a 395 mm space. The cylindrical lens array 1105a has 16 planoconvex cylindrical lenses lined up in an array, with each lens having a length of 150 mm, a width of 2 mm, a thickness of 5 mm, and a radius of curvature of 100 mm. In other words, the cylindrical lens array 1105 becomes a lens having dimensions of 150 mm×32 mm×5 mm. The transverse direction and the meridional plane are disposed in parallel. The laser beam exits from the cylindrical lens array 1105a, passes through an opening of 65 mm, and is made incident to a cylindrical lens array 1105b. The cylindrical lens array 1105b has 16 planoconcave lenses lined up in an array, with each lens having a length of 150 mm, a width of 2 mm, a thickness of 5 mm, and a radius of curvature of 80 mm. In other words, the cylindrical lens array 1105b becomes a lens having dimensions of 150 mm×32 mm×5 mm. The transverse direction and the meridional plane are disposed in parallel. Further, the 16 cylindrical lenses are disposed such that the laser beam divided into 16 parts by the cylindrical lens array 1105a is made incident to the 16 cylindrical lenses of the cylindrical lens array 1105b in the proportions of one to one. Note that, for simplicity, two groups of four cylindrical lenses each are shown in FIG. 1.

Continuing, a cylindrical lens 1106 is placed in a position that is 1600 mm behind the cylindrical lens array 1105b. The cylindrical lens 1106 is a planoconvex cylindrical lens having a length of 550 mm, a width of 60 mm, a thickness of 20 mm, and a radius of curvature equal to 486 mm. The incidence surface for the laser beam is a planar surface. The transverse direction and the meridional plane are disposed in parallel. The laser beam is thus converted once into a linear shape beam having a width on the order of 2 mm at a planar surface disposed 1000 mm behind the cylindrical lens 1106.

A doublet cylindrical lens 1108 is placed at a position 2050 mm behind the cylindrical lens 1106. A 90° reflecting mirror 1107 is placed between the cylindrical lens 1106 and the doublet cylindrical lens 1108, and a stage 1109 on which a semiconductor film is disposed is set so as to be nearly parallel with a horizontal plane. The doublet cylindrical lens 1108 is structured by two cylindrical lenses. If the surfaces from an incident surface to an exit surface are referred to as a first surface, a second surface, a third surface, and a fourth surface, then the radius of curvature of the first surface is 125 mm, the radius of curvature of the second surface is 77 mm, the radius of curvature of the third surface is 97 mm, and the radius of curvature of the fourth surface is 200 mm. A positive numeral used here indicates that the center of the radius of curvature is on the side that the laser beam exits, while a negative numeral indicates that the center of the radius of curvature is on the side that the laser beam enters. The center distance between the first surface and the second surface is 10 mm, the center distance between the second surface and the third surface is 5.5 mm, and the center distance between the third surface and the fourth surface is 20 mm. The doublet cylindrical lens has a length of 1000 mm, a width of 70 mm, and a thickness of 35.5 mm. The transverse direction and the meridional plane are disposed in parallel. The stage 1109 is disposed in a position approximately 238 mm behind the doublet cylindrical lens. The position of the stage 1109 must be determined with extreme precision. This is because the focus depth of the optical system is only on the order of 0.5 mm. The complete optical system as discussed above is defined by radius of curvature, and the numerical values are taken for lenses that use a base material having a refraction index equal to 1.4856. It is therefore needless to say that it is necessary to consider corrections to the above numerical values if the base material of the lenses has a different refraction index.

A substrate 1111 on which a semiconductor film is formed is placed on the stage 1109. The stage 1109 is provided with slight curvature having a concave cylindrical shape, with the radius of curvature equal to 40,000 mm. The center of the radius of curvature is on the side that the laser beam enters, and the curvature direction is parallel to the sagittal plane. The stage 1109 operates in a direction perpendicular to a linear shape beam 1110 (dashed line portions within the figure), and the laser beam is irradiated to the entire surface of the semiconductor film by continuing to irradiate the laser beam while the stage operates. A maximum height difference of 3 mm between the center of the substrate and the substrate edges can be formed in accordance with the curvature provided by the stage 1109. It can thus be understood that the effect of imparting a larger curvature to the stage than the focus depth of the linear shape beam (normally on the order of 0.5 mm) is absolute. Further, substrates having a side length on the order of 1 m, with a thickness on the order of 1 mm are extremely easy to bend, and the curvature is easy to impart provided that the deformation is on the order of 3 mm. The deformation imparted to the substrate disappears after the substrate is removed from the stage after laser beam irradiation is completed.

Irradiation of the linear shape beam is performed while scanning the stage 1109 in the direction of the arrow on the stage shown in FIG. 1, for example. The energy density of the linear shape beam on the semiconductor film, and the speed of the stage may be suitably determined by the operator at this point. Roughly speaking, the energy density is within a range from 100 mJ/cm$^2$ to 1000 mJ/cm$^2$. If a stage speed is selected appropriately for a range in which there is 90% or greater overlap in the transverse direction of the linear shape beams, then there is a good possibility of performing uniform laser annealing. The optimal stage speed depends upon the frequency of the laser oscillator, and may be considered to be proportional to the frequency. The example of FIG. 1 shows the movement of the stage with respect to the linear shape beam, but the stage may also be fixed, and the linear shape laser beam may be moved. It is acceptable oscillation, provided that the movement is performed in a relative manner. Further, if a continuous oscillation laser is used, then emission may be performed while moving the stage relative to the laser beam at a speed on the order of 0.5 to 2000 cm/s.

The laser annealing process is thus completed. A plurality of substrates can be processed by repeating the aforementioned steps. An active matrix liquid crystal display, for example, can be manufactured by utilizing the substrate. Manufacturing may be performed by the operator in accordance with a known method, for example.

A linear shape beam that has an extremely uniform energy distribution and a length that exceeds 500 mm can be formed by utilizing the present invention, and therefore the present invention is suitable for being incorporated into a mass production line. Laser oscillators having high output, and which are capable of ensuring sufficient energy density when a linear shape beam is expanded in the longitudinal direction, are used. The necessary output depends on the width of the linear shape beam in the transverse direction and the laser beam wavelength, but is preferable to have an energy greater than or equal to 1 J per pulse.

Although an excimer laser is used for the laser oscillator in the aforementioned example, similar high output can also be obtained by using the higher harmonic waves of YAG lasers or glass lasers in addition to the excimer laser. These lasers are preferable because silicon films have good absorption of the laser beam energy of such lasers. In addition, lasers such as $YVO_4$ lasers (higher harmonic waves), YLF lasers (higher harmonic waves), and Ar lasers may be used as laser oscillators suitable for crystallizing silicon films. The laser beam wavelength region for these laser oscillators is well absorbed by silicon films.

A linear shape beam having an extremely uniform energy distribution can thus be formed with the present invention, and therefore the physical properties of semiconductor films obtained by irradiation of this type of linear shape beam also become uniform. Dispersion in the electrical characteristics of TFTs manufactured using the semiconductor films is thus reduced, and good TFTs are obtained.

Note that, annealing through the use of a laser beam is performed in embodiment 1 in a state in which the semiconductor film is formed over the entire substrate. However, laser annealing may also be performed after first patterning the semiconductor film into a desired shape.

Embodiment 2

The energy distribution of laser beams in an irradiation surface are compared in embodiment 2 for cases in which the present invention is applied, and cases in which the present invention is not applied.

It is understood from Eq. (1)

$$(1) L = d \cdot f2/f1 \qquad \text{Eq.}(1)$$

that f2/f1 is increased in order to make the length L in the longitudinal direction of a linear shape laser beam longer. (See FIG. 3 for each variable) It is also possible to make the width d of cylindrical lenses contained in a cylindrical lens array larger. This is not preferable, however, because the number of laser beam divisions is reduced, and therefore the uniformity of the energy distribution of the linear shape beam is damaged. Further, L becomes larger if f2 is increased, but the distance between the lens and an irradiation surface increases, and therefore the footprint becomes larger, which is uneconomical. Consequently, it can be understood that it is most preferable to reduce f1 in order to increase the length L in the longitudinal direction of the linear shape beam.

A simulation of the energy distribution in the irradiation surface when using the optical system shown by FIG. 1 has been performed. A detailed explanation of the optical system can be found in embodiment 1. The beam expander 1102 is structured by a planoconcave lens having a first face curvature of 220 mm and a thickness of 7 mm, and by a planoconvex lens having a second face curvature of 400 mm, and a thickness of 12 mm, which is placed at a distance of 353 mm from the planoconcave lens. The cylindrical lens array 1103 has been disposed at a distance of 50 mm from the beam expander 1102. The curvature of the other lenses, and the distances between lenses has been as stated in embodiment 1. Note that, the structure of the optical system shown by FIG. 1 differs from the structure of the optical system shown by FIG. 2. However, a laser beam, which is similar in shape to the laser beam of FIG. 1, can be obtained on an irradiation surface in accordance with the structure of FIG. 2.

Figure 4A:
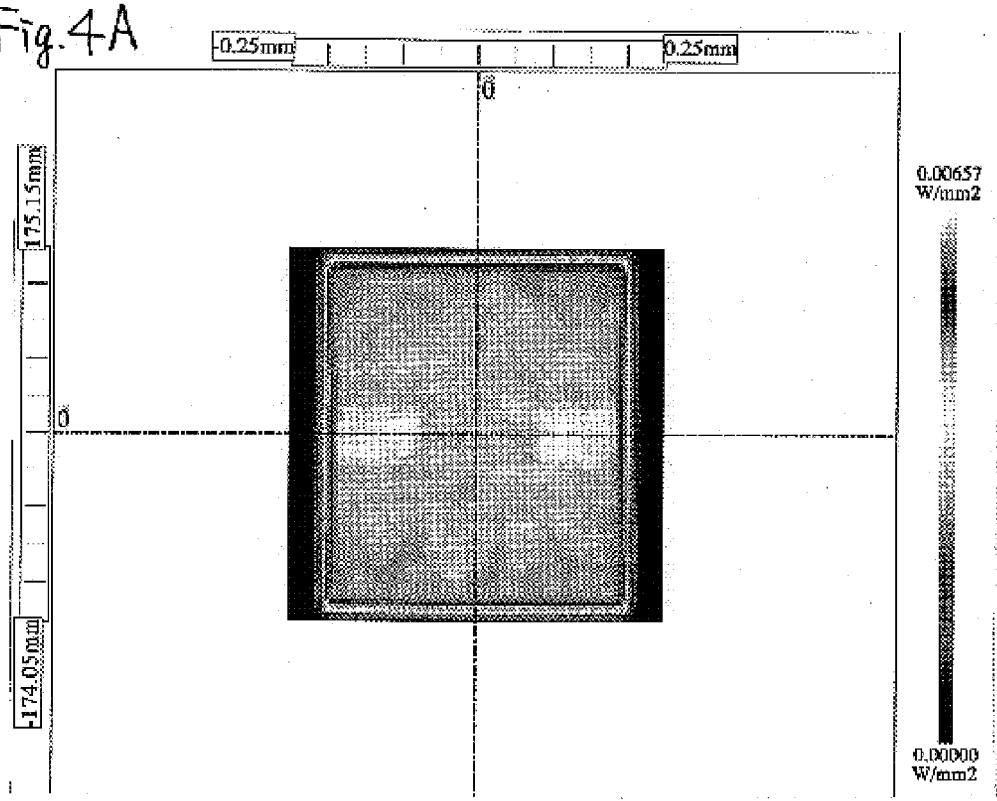
FIGS. 4A and 4B are diagrams showing the energy distribution of a linear shape beam.
Figure 4B:
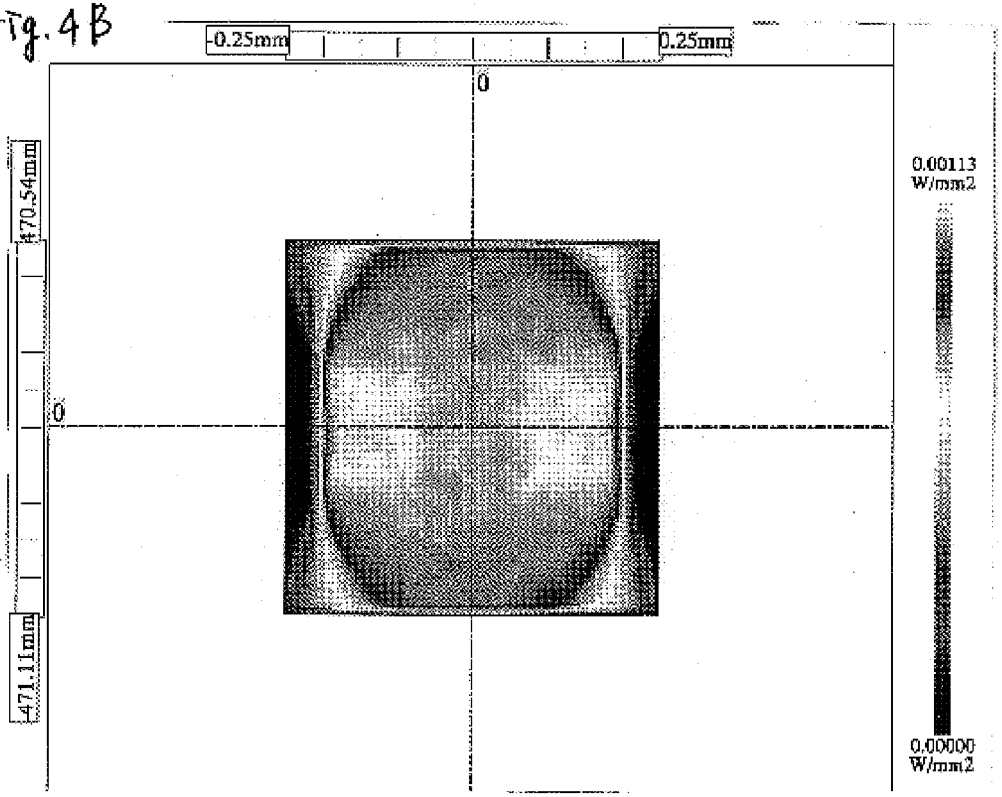

If the radius of curvature of the cylindrical lens array 1103 is taken as 14 mm in an optical system having an optical path length of approximately 5 m from the laser oscillator shown in FIG. 1 to the irradiation surface, then the size of the linear shape beam formed on the irradiation surface will become 300 mm×0.4 mm. An example of the simulation results for the energy distribution of this linear shape beam is shown in FIG. 4A. The vertical represents the linear direction of the laser beam, and the horizontal axis represents the transverse direction of the laser beam. The vertical axis applies a scale different from that for the horizontal axis in order to make the results easier to see. Hereafter, similar figures are shown in accordance with the same rules. The shading within the figures corresponds to the energy density of the laser beam. From FIG. 4A, it can be seen that an extremely uniform energy distribution can be obtained. However, when the radius of curvature of the cylindrical lens array 1103 (a cylindrical lens array 1203 if the optical system structure of FIG. 2 is used) is simply reduced to a value of 4 mm in this optical system, and the length in the longitudinal direction of the linear shape beam on the irradiation surface is increased to a length on the order of 1000 mm, the uniformity of the energy distribution of the laser beam in the longitudinal direction of the linear shape beam drops remarkably. (See FIG. 4B) Note that the length of the linear shape beam in the transverse direction remains at 0.4 mm.

The applicants of the present invention consider that the energy uniformity is adversely affected by the fact that the angle at which the laser beam expands becomes very large, which is due to the length in the longitudinal direction of the linear shape beam expanding by a large amount. It has been supposed that the focus position in the vicinity of the center of the linear shape beam differ from the focus positions at both ends of the linear shape beam, in the longitudinal direction. Using optical design software, the shape of the substrate in the irradiation surface has been changed from planar to a shape having cylindrical curvature, thus assuming a shape in which the height of the center of the substrate differs from the height at both edges of the substrate. The simulation was again performed, and the uniformity of the energy distribution of the linear shape beam increased greatly.

Figure 6:
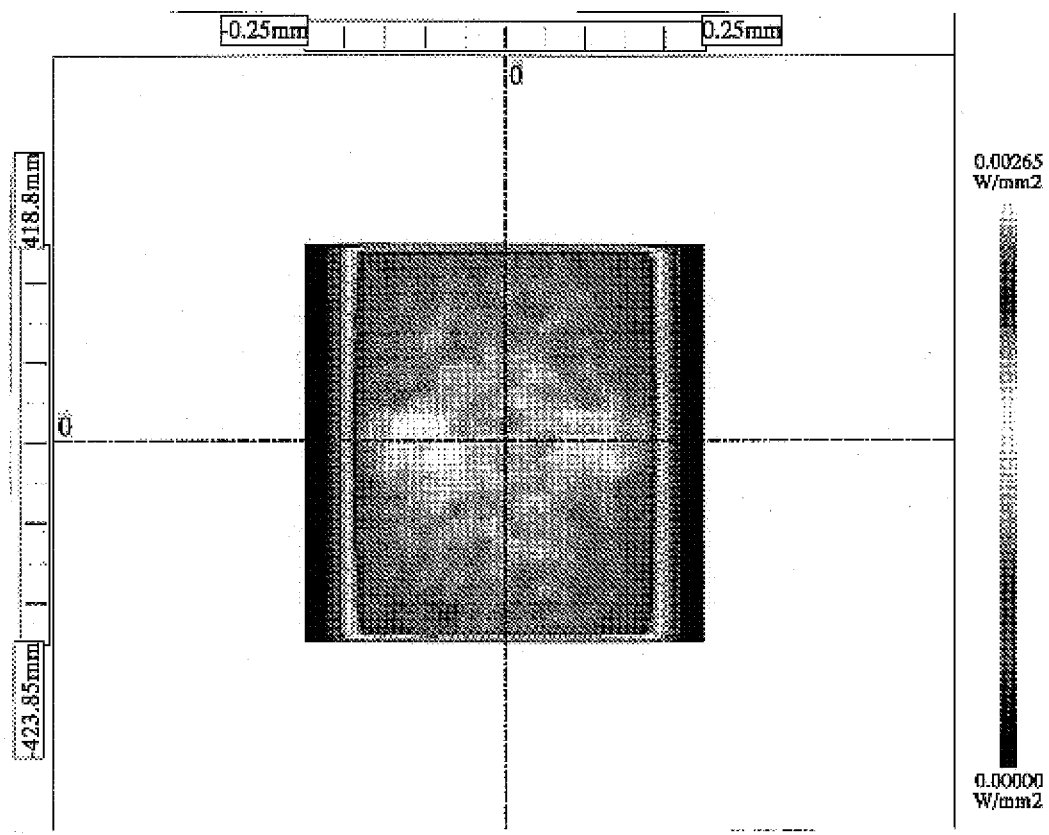
FIG. 6 is a diagram showing the energy distribution of a linear shape beam.

Simulation results for a case adding curvature to the substrate and then forming a 1000 mm×0.4 mm linear shape beam are shown in FIG. 6. It can be seen that the energy distribution of the linear shape beam is considerably improved compared with FIG. 4B.

The effectiveness of the present invention is illustrated from the aforementioned simulation results.

Embodiment 3

An example is given in embodiment 3 of an optical system that differs from the optical systems discussed in embodiment 1 and embodiment 2. Specifically, an explanation is made regarding just how much curvature must be provided to a semiconductor film when the length of a linear shape beam is changed.

The length of the linear shape beam can be changed in the optical system shown in FIG. 1 by changing the focal distance of the cylindrical lens array 1103. An example of specific numerical values is as follows: if the length of the linear shape beam is 300 mm, the radius of curvature of the cylindrical lens array 1103 may be set to 14 mm, and if the length of the linear shape beam is 600 mm, then the radius of curvature may be set to 7 mm. In other words, it can be considered that there is an inversely proportional relationship between the radius of curvature and the linear beam length.

Figure 7A:
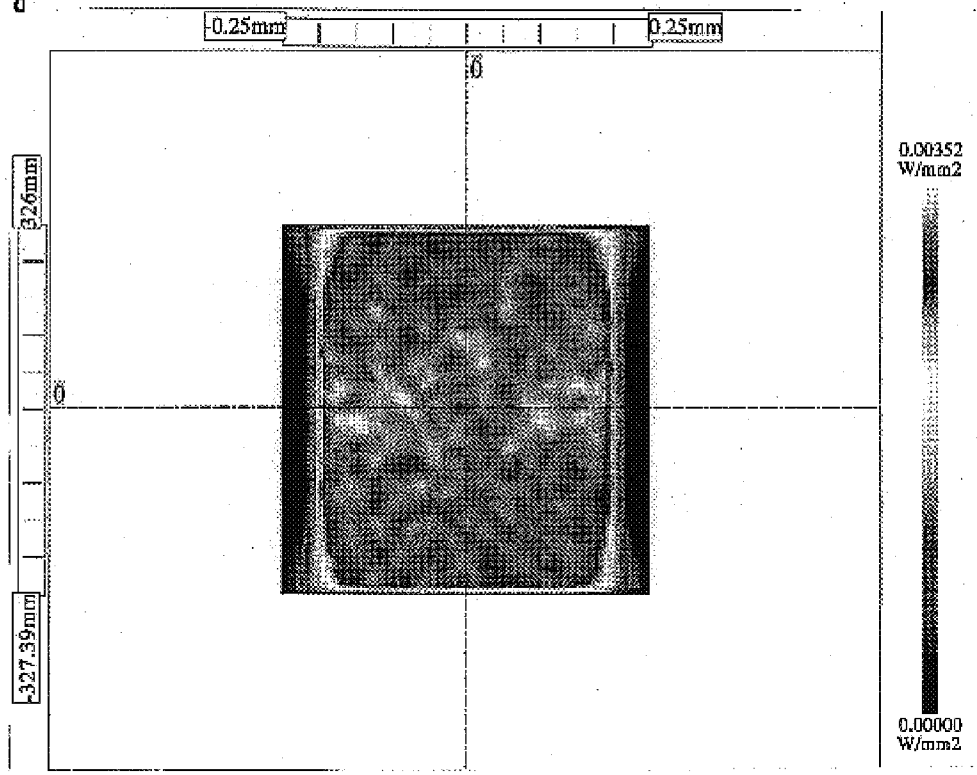
FIGS. 7A and 7B are diagrams showing the energy distribution of a linear shape beam.
Figure 7B:
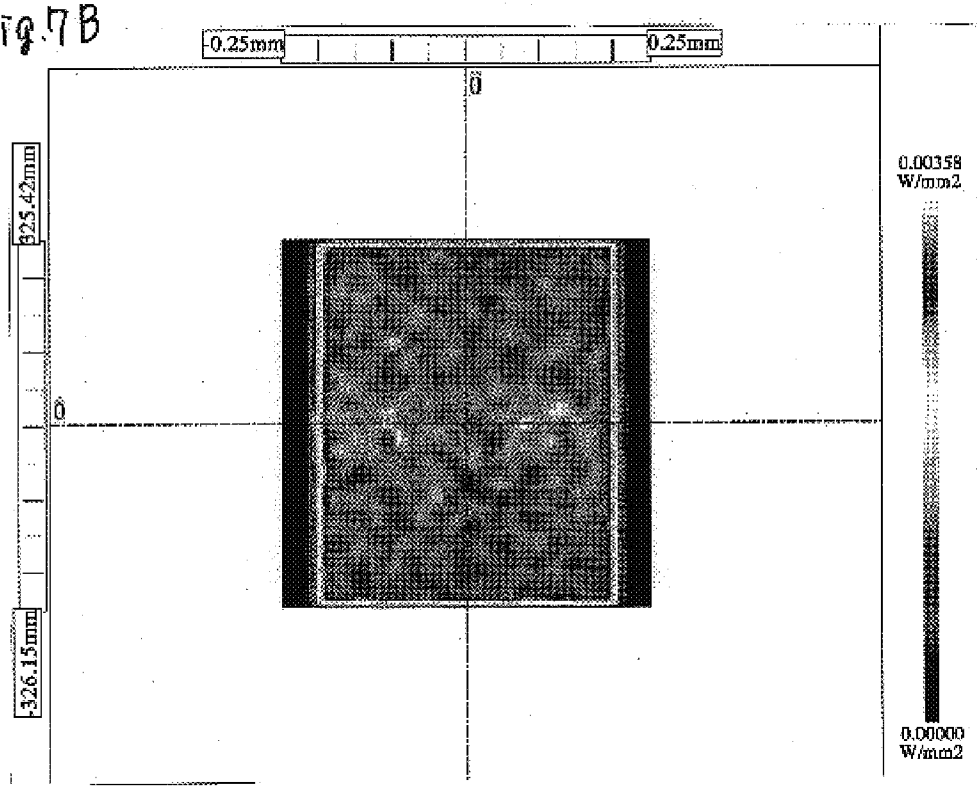

Simulation results for the energy distribution of a linear shape beam on an irradiation surface when the linear shape beam length is 600 mm are shown in FIGS. 7A and 7B. Shown in FIG. 7A are simulation results when there is no semiconductor film curvature, namely when the semiconductor film is planar. Results are shown in FIG. 7B for a simulation run wherein curvature is imparted to the semiconductor film, and the radius of curvature given to the semiconductor film has been 40,000 mm, the same as that shown in embodiment 1. It can be seen that the uniformity of the energy distribution of the linear shape beam increases greatly by imparting curvature to the semiconductor film.

Figure 8A:
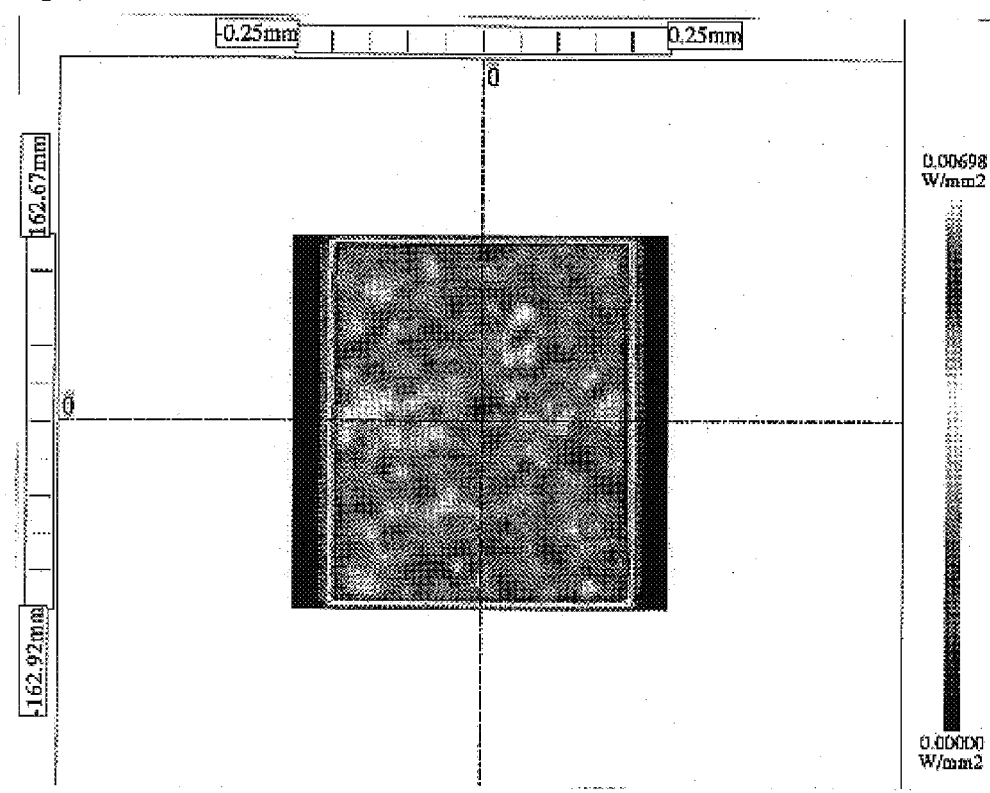
FIGS. 8A and 8B are diagrams showing the energy distribution of a linear shape beam.
Figure 8B:
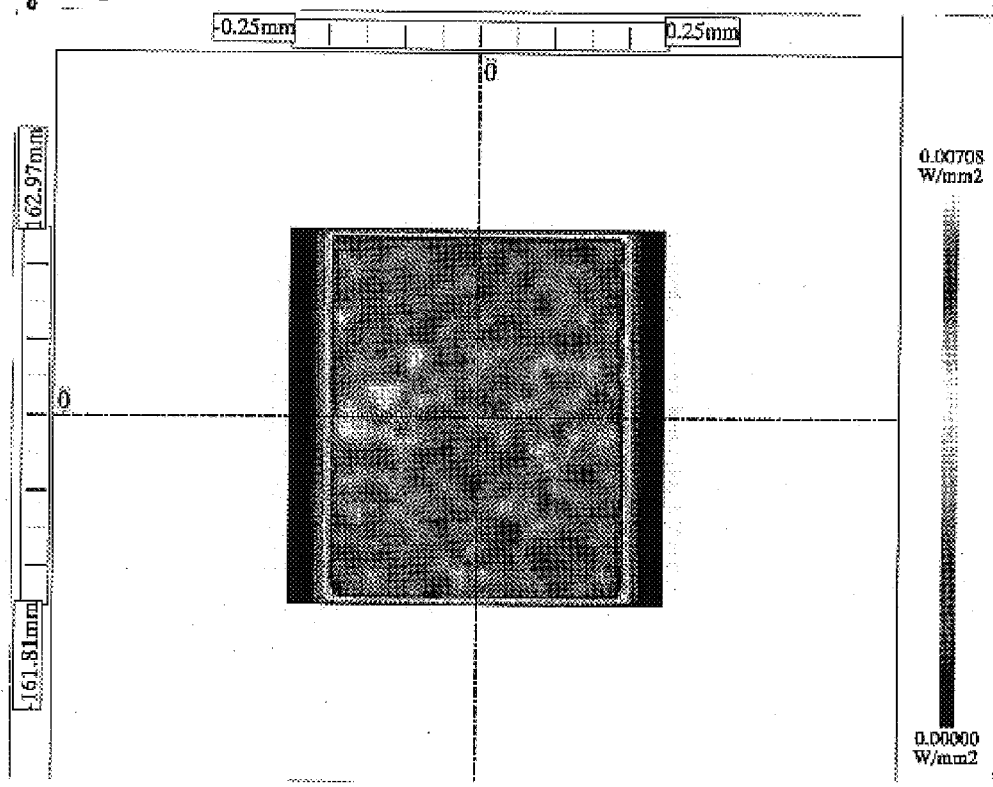

Simulation results for the energy distribution of a linear shape beam on an irradiation surface when the linear shape beam length is 300 mm are shown in FIGS. 8A and 8B. Shown in FIG. 8A are simulation results when there is no semiconductor film curvature, namely when the semiconductor film is planar. Results are shown in FIG. 8B for a simulation run wherein curvature is imparted to the semiconductor film, and the radius of curvature given to the semiconductor film has been 40,000 mm, the same as that shown in embodiment 1. It can be seen that there is no advantage difference between FIGS. 5A and 5B, and that the present invention may be preferably adapted to relatively long linear shape beams.

The optical system for the linear shape beam having a length of 600 mm illustrated by embodiment 3 may be applied when the substrate size is 600 mm×720 mm. The radius of curvature given to the substrate at this time is set to 40,000 mm, similar to that shown in embodiment 1.

Linear annealing of a semiconductor film is performed, for example, by utilizing the optical system shown by embodiment 3 in accordance with the method shown by embodiment 1. The active matrix liquid crystal display, for example, can be manufactured by utilizing the semiconductor film. Manufacture may be performed in accordance with a method predetermined by the operator.

Embodiment 4

An example of an optical system that differs from the optical systems described in embodiments 1 to 3 is given in embodiment 4. Specifically, an explanation is made regarding just how much curvature must be provided to a semiconductor film when the optical path length of the optical system is changed.

Figure 3:
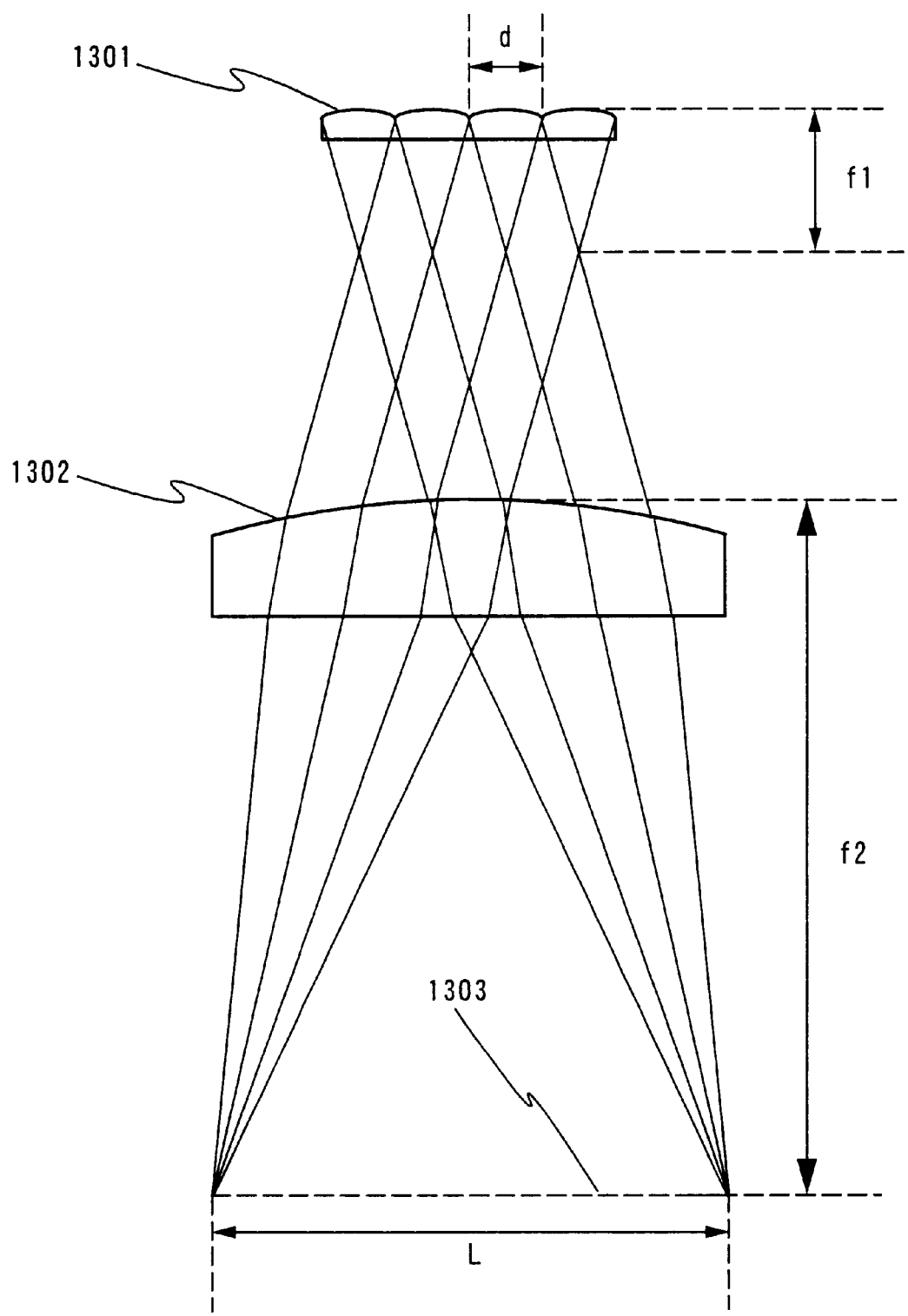
FIG. 3 is a diagram for explaining an optical system.

In order to change only the optical path length of the optical system without changing the length of a linear shape beam, the value of the focal length f1 of a cylindrical lens array 1301 and the value of the focal length f2 of a cylindrical lens array 1302 in FIG. 3 may be changed without changing the ratio between f1 and f2. In particular, the focal length f2 is almost equal to the distance between the cylindrical lens array 1302 and the irradiation surface, and therefore has a strong correlation to the optical path length of the optical system.

Figure 9:
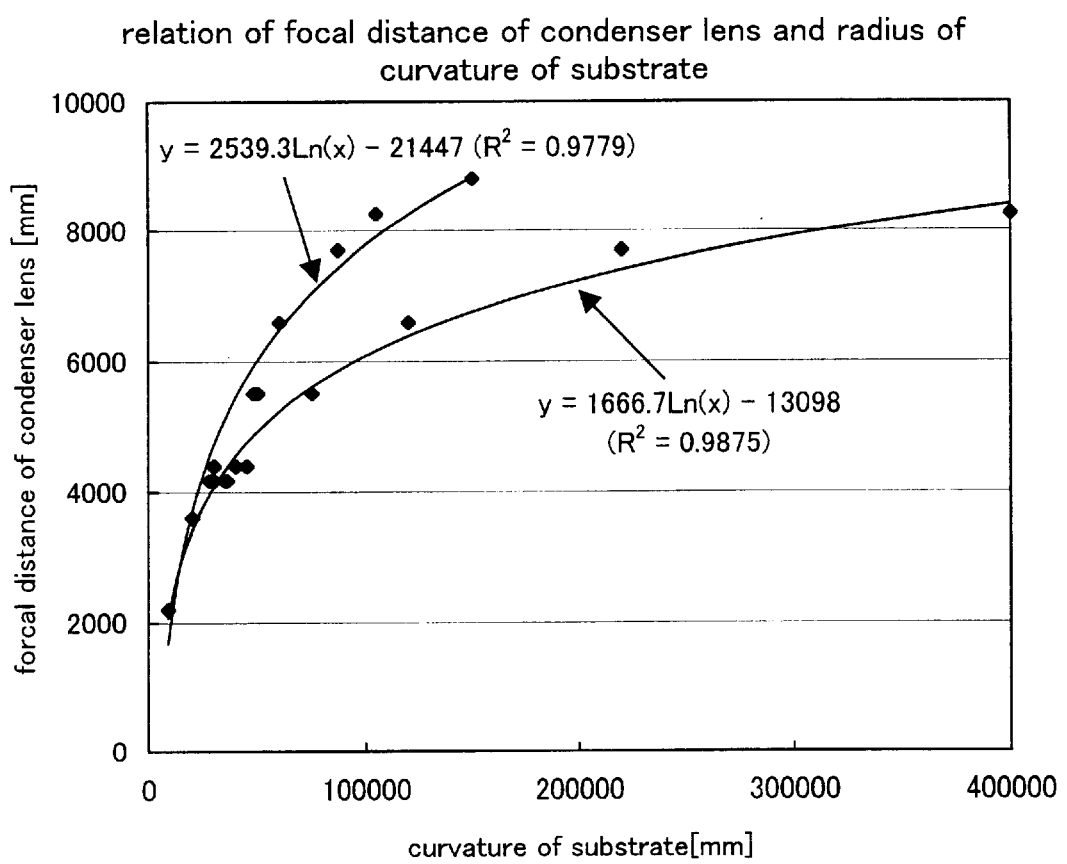
FIG. 9 is a graph showing the relation between the focal length of a condenser lens, which makes the energy distribution in the longitudinal direction of a linear shape beam more uniform, and the radius of curvature imparted to an irradiation surface.
Figure 10:
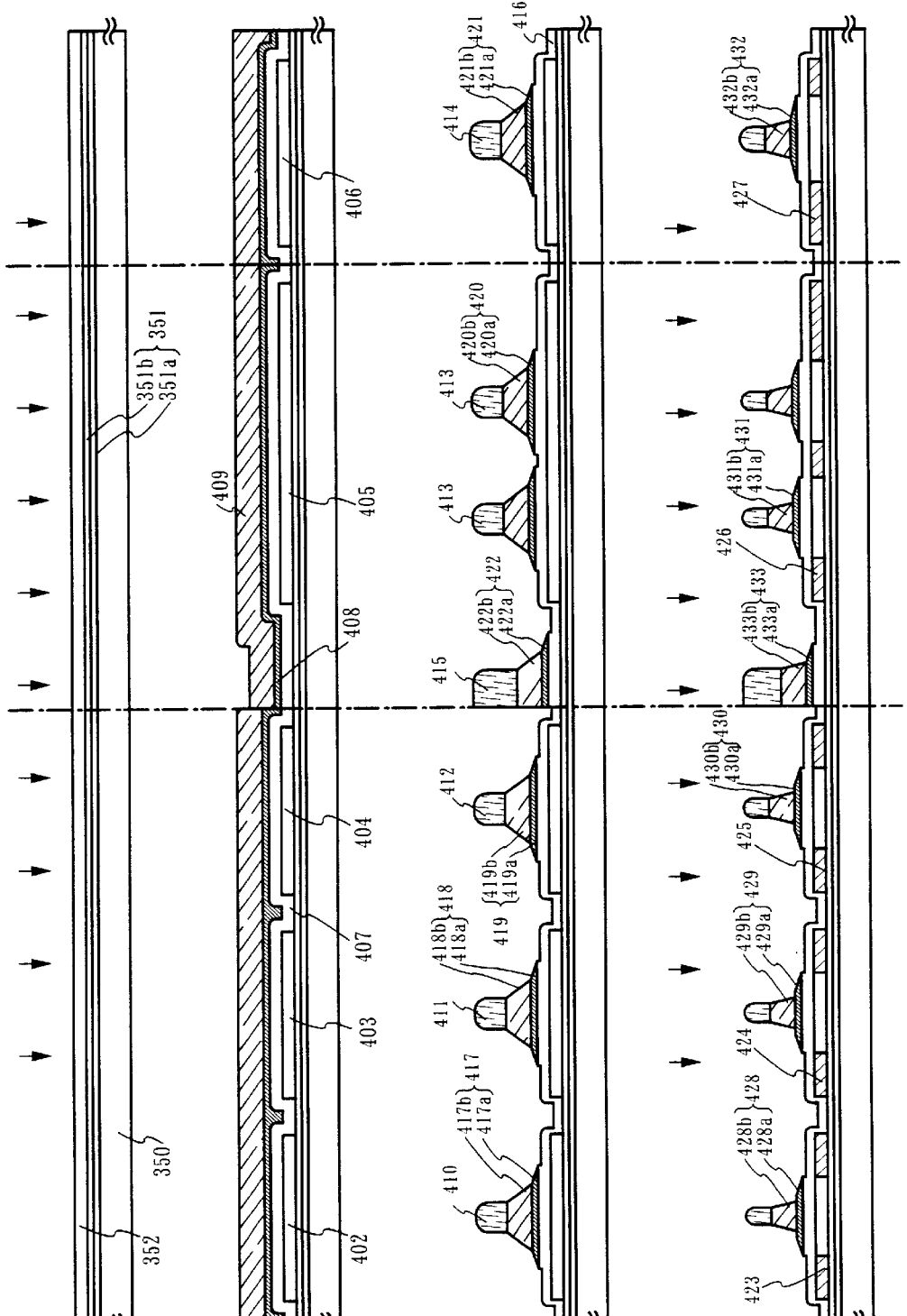
FIGS. 10A to 10D are cross sectional diagrams showing a process of manufacturing a pixel TFT and a driver circuit TFT.
Figure 11:
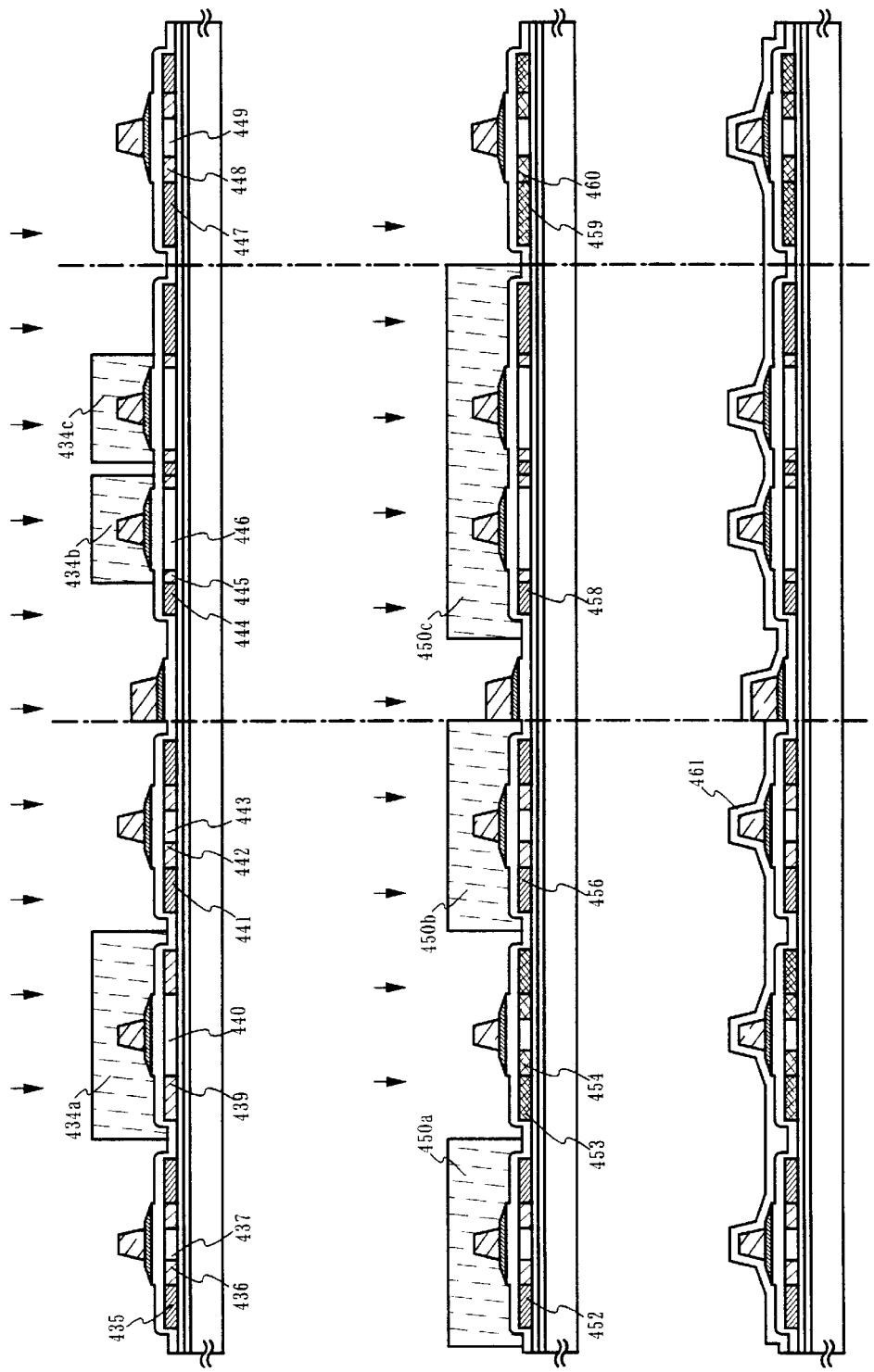
FIGS. 11A to 11C are cross sectional diagrams showing the process of manufacturing a pixel TFT and a driver circuit TFT.

In embodiment 1, the cylindrical lens 1104 corresponds to a cylindrical lens possessing the focal length f2. The focal length f2 of the cylindrical lens 1104 is on the order of 4400 mm. By changing f2 without changing the linear beam length, namely changing f2 without changing the focal length ratio between f1 and f2 (note that f1 also changes in order to keep the same ratio between f1 and f2), and investigating the energy distribution in the irradiation surface by simulation using the optical system shown in embodiment 1, a curvature radius range that the substrate must possess in order to obtain a uniform energy distribution is determined. The curvature radius range thus obtained that the substrate must possess with respect to f2 is shown in Table 1. and a graph of the correlation between f2 and the curvature radius range that the substrate must possess is shown in FIG. 9. Note that only optimal values are recorded when the focal length f2 is equal to 2200 mm and 3600 mm because the curvature radius range that the substrate must possess is relatively narrow.

TABLE 1

| forcal distance of condeser lens [mm] | radius of curvature of substrate | |
|---|---|---|
| | minmum value | maxmum value |
| 2200 | 9000 (optimum value) | |
| 3600 | 20000 (optimum value) | |
| 4180 | 28000 | 36000 |
| 4400 | 30000 | 45000 |
| 5500 | 48000 | 75000 |
| 6600 | 60000 | 120000 |
| 7700 | 87000 | 220000 |
| 8260 | 105000 | 400000 |
| 8800 | 150000 | ∞ |

Further, two equations Eq. 2 and Eq. 3 shown in FIG. 9 are approximate equations for the minimum value, and the maximum value, respectively, of the radius of curvature that the substrate must possess when f2 is changed:

(2) $y=2539.3Ln(x)-21447$      Eq. (2)

(3) $y=1666.7Ln(x)-13098$      Eq. (3)

In other words, a laser beam having a uniform energy distribution on the substrate surface can be obtained provided that the radius of curvature of the substrate with respect to f2 falls within the range of the two equations.

FIG. 9 has values for the focal length f2 of the cylindrical lens 1104 on its vertical axis, and values for the radius of curvature that the substrate must possess on its horizontal axis. The cylindrical lens 1104 can be regarded as a condenser lens for making the energy distribution uniform in the longitudinal direction of the linear shape beam due to its function. From the graph of FIG. 9, it can be seen that the radius of curvature, which the substrate must possess, increases along with increasing f2. When f2 equals 8800 mm, namely when f2 has twice the value of the optical system shown in embodiment 1, the optimal value for the radius of curvature becomes 150,000 mm. However, when the value becomes this large, the radius of curvature is infinite. The energy distribution of the linear shape beam for a planar substrate is almost the same as the energy distribution for the linear shape beam for a case in which the radius of curvature is equal to 150,000 mm. At this point, f2 is 8800 mm, and therefore the optical path length of the optical system is on the order of 10 m.

If the focal length f2 is equal to 6600 mm, for example, then the energy distribution of the linear shape beam becomes most uniform when the radius of curvature is on the order of 60,000 mm. In this case, there is a clear advantage over planar substrates, and this shows a range in which the present invention is effective. Similarly, the radius of curvature may be set to 50,000 mm when the focal length f2 is equal to 5500 mm, the radius of curvature may be set to 20,000 mm for cases in which the focal length f2 is equal to 3600 mm, and the radius of curvature may be set to 9000 mm if the focal length f2 is equal to 2200 mm. From the above discussion, the shape change of the linear shape beam becomes larger, and the energy distribution loses uniformity, if the focal length f2 is made shorter. Further, the radius of curvature imparted to the substrate becomes smaller, and the load on the substrate increases. The difference in height between the center and edge portions of a substrate having a width of 1 m is 14 mm if the substrate is bent to a 9000 mm radius of curvature. The radius of curvature imparted to the substrate does change, of course, depending upon the substrate material, but this radius of curvature is in the vicinity of the limit able to be imparted to the glass substrates generally in use at present.

Laser annealing of a semiconductor film is performed in accordance with the method shown by embodiment 1, for example, utilizing the optical system of embodiment 4. An active matrix liquid crystal display, for example, can be manufactured by utilizing the semiconductor film. Manufacturing may be performed in accordance with a method predetermined by the operator.

Embodiment 5

Another method of manufacturing a semiconductor film is shown in embodiment 5. The characteristics of the semiconductor film shown by embodiment 5 are increased remarkably if the semiconductor film shown by embodiment 5 undergoes laser annealing. A method of manufacturing a polycrystalline silicon film is discussed in embodiment 5.

First, a silicon oxide film having a thickness of 200 nm, and an amorphous silicon film having a thickness of 50 nm, are formed in order on one surface of a glass substrate. Methods such as plasma CVD and sputtering may be performed as the film forming method. The amorphous silicon film is crystallized next by thermal annealing. Thermal annealing is a heat treatment for the amorphous silicon film, for example at 600° C. in a nitrogen atmosphere for a length of time on the order of 24 hours. Alternatively, the amorphous silicon film may be crystallized by the RTA method. Further, crystallization of the amorphous silicon film may also be performed by the method disclosed in Japanese Patent Application Laid-open No. Hei 7-130652. An example of using this method is explained below.

First, a base film (for example, a 200 nm thick silicon oxide film) is formed on one surface of a glass substrate, and then an amorphous semiconductor film having a thickness of 20 to 100 nm is formed. Films such as amorphous silicon films, amorphous silicon germanium (a-SiGe) films, amorphous silicon carbide (a-SiC) films, and amorphous silicon tin (a-SiSn) films can be applied to the amorphous semiconductor film. These amorphous semiconductor films may be formed such that the amount of hydrogen contained within the amorphous semiconductor film is on the order of 0.1 to 40% of the total number of atoms. For example, an amorphous silicon film is formed having a thickness of 55 nm. A layer containing a metallic element is then formed by a spin coating method in which a liquid solution containing 10 ppm by weight of a metallic element is applied by a spinner while the substrate is rotating. Metallic elements such as nickel (Ni), germanium (Ge), iron (Fe), palladium (Pd), tin (Sn), lead (Pb), cobalt (Co), platinum (Pt), copper (Cu), and gold (Au) may be used as the metallic element. In addition to spin coating, the layer containing the metallic element may also be formed by printing, spraying, bar coating, sputtering, and vacuum evaporation methods, and is formed having a thickness of 1 to 5 nm.

For a crystallization process, it is preferable to first perform heat treatment at 400 to 500° C. for a period on the order of 1 hour in a nitrogen atmosphere, thus reducing the amount of hydrogen contained within the amorphous silicon film to a level equal to or less than 5% of the total number of atoms contained within the amorphous silicon film. It is not necessary to perform that heat treatment for cases in which the amount of hydrogen contained within the amorphous silicon film after film formation is already equal to or less than 5%. Heat treatment is then performed within a nitrogen atmosphere at a temperature of 550 to 600° C. for 1 to 8 hours using an annealing furnace. A polycrystalline semiconductor film composed of a polycrystalline silicon film can thus be obtained by the aforementioned processes. However, if the polycrystalline semiconductor film manufactured by thermal annealing is observed by using an optical microscope, localized amorphous regions remaining within the film may be seen. Similarly, amorphous components possessing a broad peak at 480 $cm^{-1}$ can be observed by Raman spectroscopy for cases in which the amorphous regions remain. Processing the polycrystalline semiconductor film by using the laser annealing method disclosed in embodiment 5 after thermal annealing, thus increasing crystallinity, can therefore be applied as an effective means. The crystallization process may also be performed by the RTA method.

The crystalline semiconductor shown in the manufacturing example in embodiment 5 has an absorption coefficient wavelength dependence, which differs from that of an amorphous semiconductor film. In particular, the difference between the two is large in the visible light region. For example, the absorption coefficient of the crystalline silicon film for the wavelengths of the second harmonic wave of a YAG laser or the second harmonic wave of a glass laser is an order of magnitude smaller than that of the amorphous silicon film. Therefore, it is preferable that the energy density of the linear shape beam be made to differ between amorphous semiconductor films and crystalline semiconductor films when a visible light laser is used in the laser oscillator. On the other hand, if an excimer laser, the third harmonic wave of a YAG laser, or the like is used in the laser oscillator, then there is almost no difference in the optimal linear shape beam energy density between both film types during laser annealing because the absorption coefficient is nearly the same for amorphous silicon films and crystalline silicon films.

Embodiment 6

In this embodiment, a method of manufacturing an active matrix substrate will be described with reference to FIGS. 10A to 13. A substrate on which a CMOS circuit, a driver circuit, and a pixel portion having a TFT pixel and a holding capacity are formed together is called active matrix substrate for convenience.

First, a substrate 350 formed of glass such as barium borosilicate glass and aluminum borosilicate glass is used in this example. The substrate 350 may be a quartz substrate, a silicon substrate or a metal substrate or stainless substrate, which has an insulating film on the surface. The substrate 350 may be a plastic substrate having heat resistance, which withstands a processing temperature in this embodiment.

Next, a primary film 351 having an insulating film such as silicon oxide film, silicon nitride film, and a silicon oxide nitride film is formed on the substrate 350. In this embodiment, a two-layer structure is used for the primary film 351. However, a structure may be used where a single layer film, which is the insulating film itself, or at least two layers are stacked. As a first layer of the primary film 351, a silicon oxide nitride film 351a is formed 10 to 200 nm (preferably 50 to 100 nm) thick by using $SiH_4$, $NH_3$ and $N_2O$ as a reaction gas in accordance with the plasma CVD method. In this embodiment, a silicon oxide nitride film 351a (compositional ratio: Si=32%, O=27%, N=24% and H=17%) was formed 50 nm thick. Next, as a second layer of the primary film 351, a silicon oxide nitride film 351b is formed 50 to 200 nm (preferably 100 to 150 nm) thick by using $SiH_4$ and $N_2O$ as a reaction gas in accordance with the plasma CVD method. In this embodiment, a silicon oxide nitride film 351b (compositional ratio: Si=32%, O=59%, N=7% and H=2%) is formed 100 nm thick.

Next, semiconductor layers 402 to 406 are formed on the primary film. First, semiconductor film 352 having an amorphous structure is formed 25 to 80 nm thick (preferably 30 to 60 nm) by a publicly known method (such as the sputtering method, LPCVD method and plasma CVD method). Crystallization is performed to the semiconductor film by the laser crystallization method using the present invention. When a crystalline semiconductor film is produced in accordance with the laser crystallization method, the pulse type or the continuous light-emitting type of solid laser, gaseous laser or metal laser is preferable to be used. As above mentioned solid laser, the pulse type or the continuous light-emitting type of YAG laser, $YVO_4$ laser, YLF laser, $YAlO_3$ laser, glass laser, ruby laser or Ti: sapphire laser may be applied. As above mentioned gas laser, the pulse type or the continuous light-emitting type of excimer laser, Ar laser, Kr laser and $CO_2$ laser etc. As above mentioned metal laser, helium cadmium laser, copper vapor laser and gold vapor laser can be applied. When these types of laser are used, a method is preferable whereby laser beam emitted from a laser oscillation is gathered by an optical system and is irradiated to a semiconductor film. The condition of the crystallization may be selected by the practitioner as necessary. However, when excimer laser is used, the pulse frequency is 300 Hz and the laser energy density is 100 to 1200 mJ/cm$^2$, preferably 100 to 700 mJ/cm$^2$ (typically 200 to 500 mJ/cm$^2$). Preferably, when YAG laser is used, the second harmonic is used, and the pulse frequency is 1 to 10000 Hz, preferably 1 to 300 Hz. The laser energy density is 200 to 1800 mJ/cm$^2$, preferably 300 to 1000 mJ/cm$^2$ (typically 350 to 500 mJ/cm$^2$). Then laser light gathered linearly of 10 to 1000 μm wide, or 400 μm wide in this embodiment, is irradiated all over the surface of the substrate. The overlap percentage of the linear beams may be 50 to 98%. When continuous laser oscillation is used, the energy density thereof must be the order of 0.01 to 100 MW/cm$^2$ (preferably 0.1 to 10 MW/cm$^2$). The stage is moved relatively with respect to laser light at a speed of the order of 0.5 to 2000 cm/s for the irradiation of the laser light to form the crystal semiconductor film.

Further, the crystallization can be carried out by combining another known crystallization method (such as RTA method, using thermal crystallization annealing using an annealing furnace and thermal crystallization annealing using a metal element promoting crystallization) with laser crystallization method.

Patterning is performed on the obtained crystalline semiconductor film in a desired form in order to form the semiconductor lasers 402 to 406. The semiconductor film may be an amorphous semiconductor film, a fine crystal semiconductor film 352 or a crystalline semiconductor film. Alternatively, the semiconductor film 352 may be a compound semiconductor film having an amorphous structure such as an amorphous silicon germanium film. In this embodiment, plasma CVD method is used to form an amorphous silicon film 55 nm thick. The semiconductor film is crystallized to form the crystal silicon film by excimer laser. The semiconductor layers 402 to 406 are formed by performing patterning processing thereon by using the photolithography method.

After the semiconductor layers 402 to 406 are formed, a small amount of impurity element (boron or phosphorus) may be doped in order to control a threshold value of the TFT.

Next, a gate insulating film 407 covering the semiconductor layers 402 to 406 is formed. The gate insulating film 407 is formed by using insulating film 40 to 150 nm thick containing silicon in accordance with plasma CVD method or sputtering method. In this embodiment, a silicon oxide nitride film (compositional ratio: Si=32%, O=59%, N=7% and H=2%) 110 nm thick is formed in accordance with the plasma CVD method. Notably, the gate insulating film is not limited to the silicon oxide nitride film but an insulating film containing other silicon may be used as a single layer or as a laminated pad.

When a silicon oxide film is used, it is formed by mixing Tetraethyl Orthosilicate (TEOS) and $O_2$ by plasma CVD method, which is discharged under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. thereafter can give good characteristics to the silicon oxide film produced in this way as a gate insulating film.

Next, a first conductive film 408, which is 20 to 100 nm thick, and a second conductive film 409, which is 100 to 400 nm thick, is stacked on the gate insulating film 407. In this embodiment, the first conductive film 408 formed by a TaN film 30 nm thick and the second conductive film 409 formed by a W film 370 nm thick are stacked. The TaN film is formed by using Ta target to perform sputtering in an atmosphere containing nitrogen. The W film is formed by using W target to perform sputtering. Alternatively, it can be formed by thermal CVD method using 6 tungsten fluorides ($WF_6$). In both cases, the use of the gate electrode needs low resistance. Therefore, the resistivity of the W film is desirably 20 μΩcm or below. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive film 408 is TaN and the second conductive film 409 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Next, resist masks 410 to 415 using photolithography method are formed, and first etching processing is performed thereon in order to form electrodes and wirings. The first etching processing is performed under first and second etching conditions (FIG. 10C). The first etching condition in this embodiment is to use Inductively Coupled Plasma (ICP) etching and to use $CF_4$ and $Cl_2$ and $O_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. Here, a dry etching device using ICP (Model E645-□ICP) manufactured by Matsushita Electric Industrial Co., Ltd was used. 150 W of RF (13.56 MHz)

power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the resist masks 410 to 415. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

In the first etching processing, when the form of the resist mask is appropriate, the form of the ends of the first and the second conductive layers are in the tapered form due to the effect of the bias voltage applied to the substrate side. The angle of the tapered portion is 15 to 45°. Thus, conductive layers 417 to 422 in a first form are formed which include the first conductive layers and the second conductive layers (first conductive layers 417a to 422a and second conductive layer 417b to 422b) through the first etching processing. In a gate insulating film 416, an area not covered by the first conductive layers 417 to 422 is etched by about 20 to 50 nm so as to form a thinner area.

Next, second etching processing is performed without removing resist masks (FIG. 10D). Here, $CF_4$, $Cl_2$ and $O_2$ are used to etch the W film selectively. Then, second conductive layers 428b to 433b are formed by the second etching processing. On the other hand, the first conductive layers 417a to 422a are not etched very much, and conductive layers 428 to 433 in the second form are formed.

First doping processing is performed without removing resist masks and low density of impurity element, which gives n-type to the semiconductor layer, is added. The doping processing may be performed in accordance with the ion-doping method or the ion-implanting method. The ion doping method is performed under a condition in the dose of $1 \times 10^{13}$ to $5 \times 10^{14}/cm^2$ and the accelerating voltage of 40 to 80 keV. In this embodiment, the ion doping method is performed under a condition in the dose of $1.5 \times 10^{13}/cm^2$ and the accelerating voltage of 60 keV. The n-type doping impurity element may be Group 15 elements, typically phosphorus (P) or arsenic (As). Here, phosphorus (P) is used. In this case, the conductive layers 428 to 433 function as masks for the n-type doping impurity element. Therefore, impurity areas 423 to 427 are formed in the self-alignment manner. An n-type doping impurity element in the density range of $1 \times 10^{18}$ to $1 \times 10^{20}/cm^{-1}$ is added to the impurity areas 423 to 427.

When resist masks are removed, new resist masks 434a to 434c are formed. Then, second doping processing is performed by using higher accelerating voltage than that used in the first doping processing. The ion doping method is performed under a condition in the dose of $1 \times 10^{13}$ to $1 \times 10^{15}/cm^2$ and the accelerating voltage of 60 to 120 keV. In the doping processing, the second conductive layers 428b to 432b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 11A. The ion doping method is performed under a condition in the dose of $1 \times 10^{15}$ to $1 \times 10^{17}/cm^2$ and the accelerating voltage of 50 to 100 keV. Through the second doping processing and the third doping processing, an n-type doping impurity element in the density range of $1 \times 10^{18}$ to $5 \times 10^{19}/cm^3$ is added to the low density impurity areas 436, 442 and 448, which overlap with the first conductive layer. An n-type doping impurity element in the density range of $1 \times 10^{19}$ to $5 \times 10^{21}/cm^3$ is added to the high density impurity areas 435, 441, 444 and 447.

With proper accelerating voltage, the low density impurity area and the high density impurity area can be formed by performing the second doping processing and the third doping processing once.

Next, after removing resist masks, new resist masks 450a to 450c are formed to perform the fourth doping processing. Through the fourth doping processing, impurity areas 453 to 456, 459 and 460, to which an impurity element doping a conductive type opposite to the one conductive type is added, in a semiconductor layer, which is an active layer of a p-channel type TFT. Second conductive layers 428a to 432a are used as mask against the impurity element, and the impurity element giving p-type is added so as to form impurity areas in the self-alignment manner. In this embodiment, the impurity areas 453 to 456, 459 and 460 are formed by applying ion-doping method using diborane $(B_2H_6)$ (FIG. 11B). During the fourth doping processing, the semiconductor layer forming the n-channel TFT is covered by resist masks 450a to 450c. Thorough the first to the third doping processing, phosphorus of different densities is added to each of the impurity areas 438 and 439. Doping processing is performed such that the density of p-type doping impurity element can be $1 \times 10^{19}$ to $5 \times 10^{21}$ atoms/$cm^3$ in both areas. Thus, no problems are caused when they function as the source region and the drain region of the p-channel TFT.

Impurity areas are formed in the semiconductor layers, respectively, through the processes above.

Next, the resist masks 450a to 450c are removed and a first interlayer insulating film 461 is formed thereon. The first interlayer insulating film 461 may be an insulating film 100 to 200 nm thick containing silicon, which is formed by plasma CVD method or sputtering method. In this embodiment, silicon oxide nitride 150 nm thick is formed by plasma CVD method. The first interlayer insulating film 461 is not limited to the silicon oxide nitride film but may be the other insulating film containing silicon in a single layer or in a laminated pad.

Next, as shown in FIG. 11C, heating processing is performed to recover the crystalline characteristic of the semiconductor layers and to activate the impurity element added to each of the semiconductor layer. The heating processing is performed by thermal annealing method using an annealing furnace. The thermal annealing method may be performed in an atmosphere of nitrogen with the oxygen density of 1 ppm or below, preferably 0.1 ppm or below, at 400 to 700° C., typically at 500 to 550° C. In this embodiment, the activation processing is performed through thermal processing at 550° C. for four hours. In addition to the thermal annealing method, laser annealing method or rapid thermal annealing method (RTA method) may be applied. When the laser annealing method is used to the large size substrate such as 600×720 mm, the laser irradiation device disclosed in the present invention is preferable to be used. The types of the continuous or the pulse oscillations of solid laser, gaseous laser, or metal laser are preferable to be used as a laser. When continuous laser oscillation is used, the energy density thereof must be the order of 0.01 to 100 MW/cm$^2$ (preferably 0.01 to 10 MW/cm$^2$). The substrate is moved relatively with respect to laser light at a speed of the order of 0.5 to 2000 cm/s for the irradiation of the laser light. When excimer laser is used, the pulse frequency is 300 Hz and the laser energy density is 50 to 1000 mJ/cm$^2$, (typically 50 to 700 mJ/cm$^2$). The overlap percentage of the linear beams may be 50 to 98%.

Alternatively, the heating processing may be performed before the first interlayer insulating film is formed. However, when a wiring material in use is sensitive to heat, the activation processing is preferably performed after forming an interlayer insulating film (insulating film mainly containing silicon such as silicon nitride film) for protecting the wirings like this embodiment.

After the heating processing (thermal processing at 300 to 550° C. for 1 to 12 hours) is performed, hydrogenation can be performed. This process terminates the dangling bond of the semiconductor layer with hydrogen contained in the first interlayer insulating film 461. The semiconductor layer can be hydrogenated regardless of the existence of the first interlayer insulating film. Alternatively, the hydrogenation may be plasma hydrogenation (using hydrogen excited by plasma) or heating processing in an atmosphere containing 3 to 100% of hydrogen at 300 to 450° C. for 1 to 12 hours.

When laser annealing method is used for the activation processing, laser light such as excimer laser and YAG laser is desirably irradiated after the hydrogenation is performed.

Next, a second interlayer insulating film 462 formed by a non-organic insulating material or an organic insulating material is formed on the first interlayer insulating film 461. In this embodiment, an acrylic resin film 1.6 μm thick is formed, whose viscosity is 10 to 1000 cp, preferably 40 to 200 cp and which has depressions and projections formed on the surface.

In this embodiment, in order to prevent mirror reflection, a second interlayer insulating film 462 having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same mask for forming a TFT. Thus, the projecting portion can be formed without any increase in the number of steps. The projecting portion may be provided as necessary on the substrate in the pixel area except for wirings and the TFT portion. Accordingly, projections and depressions can be formed on the surface of the pixel electrode along the projections and depressions formed on the surface of an insulating film covering the projecting portion.

Alternatively, the second interlayer insulating film 462 may be a film having a flattened surface. In this case, after the pixel electrode is formed, projections and depressions are formed on the surface by performing an added process such as publicly known sand-blast method and etching method. Preferably, by preventing mirror reflection and by dispersing reflected light, the whiteness is increased.

Figure 12:
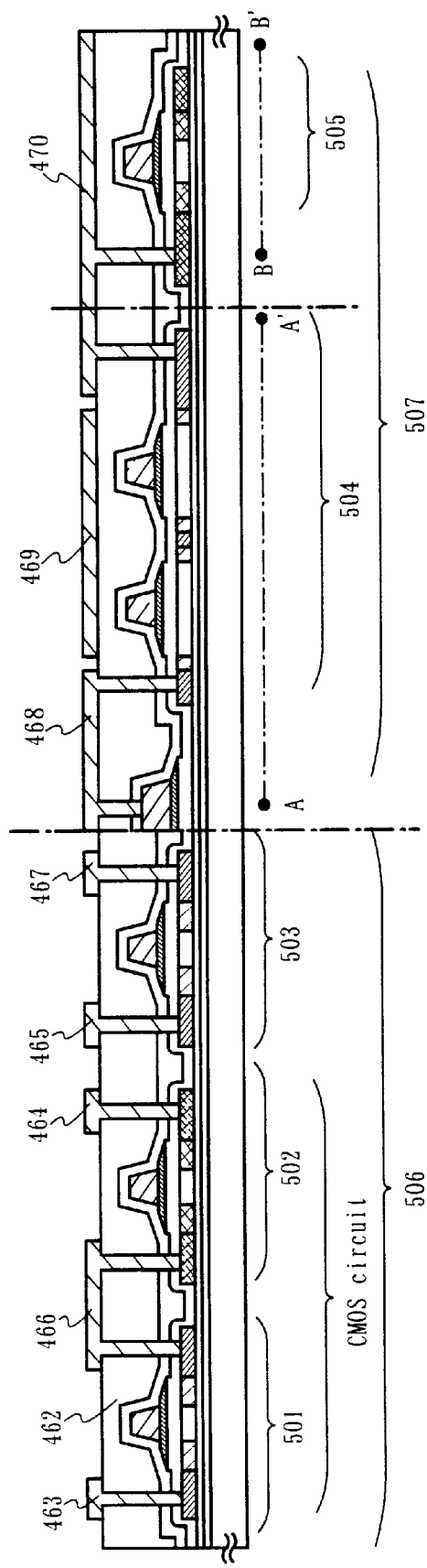
FIG. 12 is a cross sectional diagram showing the process of manufacturing a pixel TFT and a driver circuit TFT.

Wirings 464 to 468 electrically connecting to impurity areas, respectively, are formed in a driver circuit 506. These wirings are formed by patterning a film laminating a Ti film 50 nm thick and an alloy film (alloy film of Al and Ti) 500 nm thick. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 12).

In a pixel portion 507, a pixel electrode 470, a gate wiring 469 and a connecting electrode 468 are formed. Source wirings (a laminate of layers 443*a* and 443*b*) are electrically connected with a TFT pixel by the connecting electrode 468. The gate wiring 469 is electrically connected with a gate electrode of the TFT pixel. A pixel electrode 470 is electrically connected with a drain region 442 of the TFT pixel. Furthermore, the pixel electrode 471 is electrically connected with a semiconductor layer 458 functioning as one electrode forming a storage capacitor. Desirably, a material having excellent reflectivity such as a film mainly containing Al or Ag or the laminate film is used for the pixel electrode 471.

In this way, the driver circuit 506 having a CMOS circuit including an n-channel TFT 501 and a p-channel TFT 502 and a n-channel TFT 503, and the pixel portion 507 having the TFT pixel 504 and the storage capacitor 505 can be formed on the same substrate. Thus, an active matrix substrate is completed.

The n-channel TFT 501 of the driver circuit 506 has a channel formed area 437, a low density impurity area 436 overlapping with the first conductive layer 428*a*, which constructs a part of the gate electrode, (GOLD area) and a high density impurity area 452 functioning as the source region or the drain region are implanted. The p-type channel TFT 502 forming a CMOS circuit together with the n-channel TFT 501, which are connected by an electrode 466, has a channel formed area 440, a high density impurity area 454 functioning as the source region or the drain region, and an impurity area 453 to which an n-type doping impurity element and a p-type doping impurity element are implanted. The n-channel TFT 503 has a channel formed area 443, a low density impurity area 442 overlapping with the first conductive layer 430*a*, which constructs a part of the gate electrode, (GOLD area), a high density impurity area 456 functioning as the source region or the drain region, and an impurity area 455 to which an n-type doping impurity element and a p-type doping impurity element are implanted.

The TFT pixel 504 of the pixel portion has a channel formed area 446, a low density impurity area 445 formed outside of the gate electrode (LDD region), a high density impurity area 458 functioning as the source region or the drain region and an impurity region 457 injected an n-type doping impurity element and a p-type doping impurity element are implanted. An n-type doping impurity element and a p-type doping impurity element are added to a semiconductor layer functioning as one electrode of the storage capacitor 505. The storage capacitor 505 is formed by an electrode (a laminate of layers 432*a* and 432*b*) and a semiconductor layer by using the insulating film 416 as a dielectric.

The pixel structure in this embodiment is arranged such that light can be blocked in a space between pixel electrodes and the ends of the pixel electrodes can overlap with the source wiring without using the black matrix.

Figure 13:
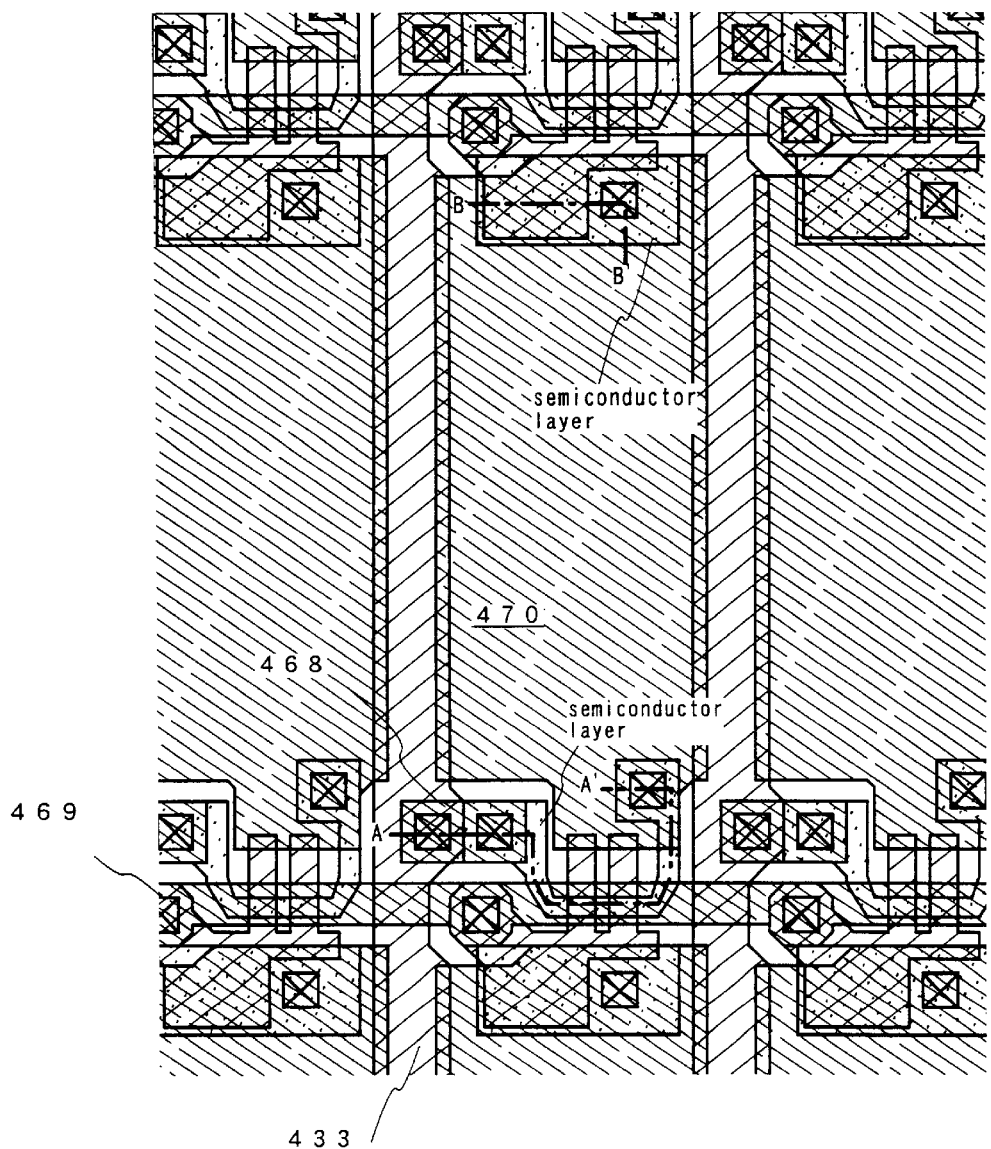
FIG. 13 is an upper view showing the structure of a pixel TFT.

FIG. 13 shows a top view of the pixel portion of the active matrix substrate produced in this embodiment. The same reference numerals are used for the corresponding parts in FIGS. 10 to 13. A broken line A-A' in FIG. 12 corresponds to a sectional view taken along a broken line A-A' in FIG. 13. A broken line B-B' in FIG. 12 corresponds to a sectional view taken along a broken line B-B' in FIG. 13.

It should be noted that this embodiment can be combined with any one of Embodiments 1 to 5 freely.

Embodiment

Figure 14:
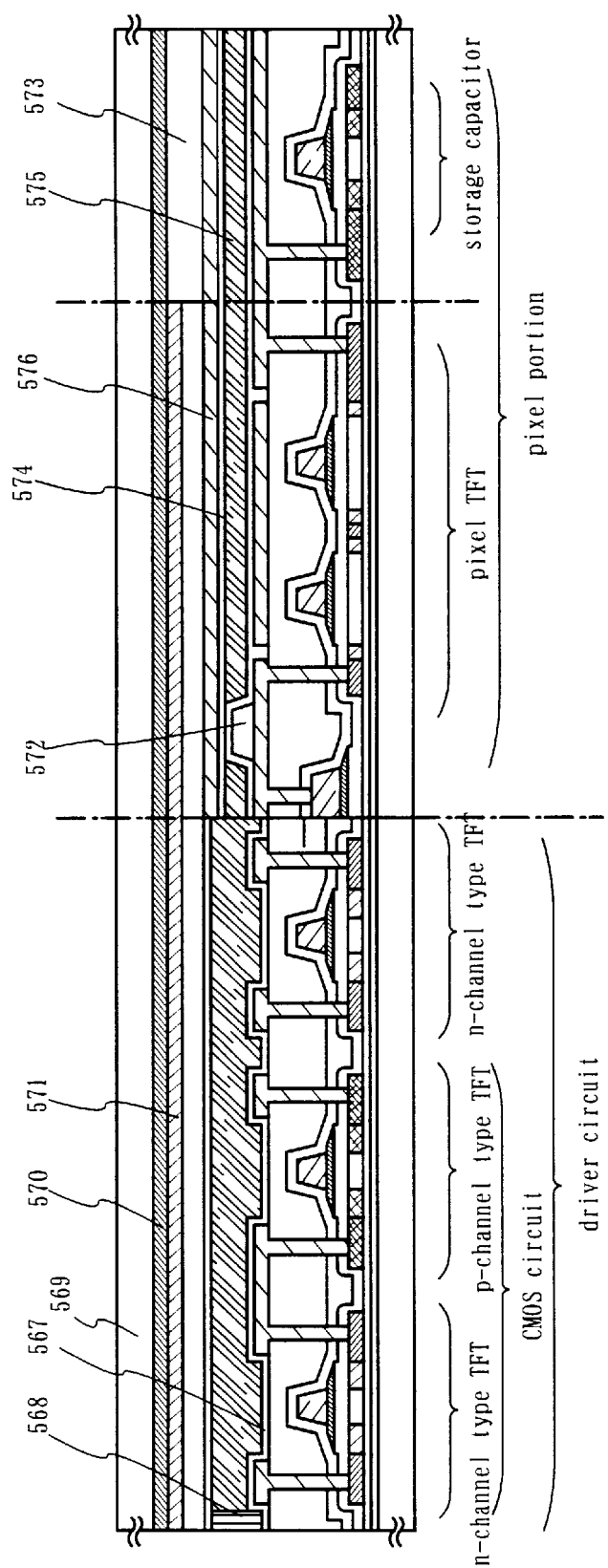
FIG. 14 is a cross sectional diagram showing a process of manufacturing an active matrix liquid crystal display device.

This embodiment explains, below, a process to manufacture a reflection type liquid crystal display device from the active matrix substrate made in Embodiment 6, using FIG. 14. Though there is no description about the present invention in this embodiment, the present invention may be applied to this embodiment, because this embodiment uses the active matrix substrate formed in Embodiment 6.

First, after obtaining an active matrix substrate in the state of FIG. 12 according to Embodiment 6, an orientation film 567 is formed at least on the pixel electrodes 470 on the active matrix substrate of FIG. 12 and subjected to a rubbing process. Incidentally, in this embodiment, prior to forming an orientation film 567, an organic resin film such as an acryl resin film is patterned to form columnar spacers 572 in a desired position to support the substrates with spacing. Meanwhile, spherical spacers, in place of the columnar spacers, may be distributed over the entire surface of the substrate.

Then, a counter substrate 569 is prepared. Then, a coloring layer 570, 571 and a planarizing film 573 are formed on a counter substrate 569. A shade portion is formed by overlapping a red coloring layer 570 and a blue coloring layer 571 together. Meanwhile, the shade portion may be formed by partly overlapping a red coloring layer and a green coloring layer.

In this embodiment is used a substrate shown in Embodiment 6. Accordingly, in FIG. 13 showing a top view of the pixel portion of Embodiment 6, there is a need to shade at least the gap between the gate wiring 469 and the pixel electrode 470, the gap between the gate wiring 469 and the connecting electrode 468 and the gap between the connecting electrode 468 and the pixel electrode 470. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 576 of a transparent conductive film is formed on the planarizing film 573 at least in the pixel portion. An orientation film 574 is formed over the entire surface of the counter substrate and subjected to a rubbing process.

Then, the active matrix substrate formed with the pixel portion and driver circuit and the counter substrate are bonded together by a seal member 568. The seal member 568 is mixed with filler so that the filler and the columnar spacers bond together the two substrates through an even spacing. Thereafter, a liquid crystal material 575 is poured between the substrates, and completely sealed by a sealant (not shown). The liquid crystal material 575 may be a known liquid crystal material. In this manner, completed is a reflection type liquid crystal display device shown in FIG. 14. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as above uses semiconductor film, which is uniformly crystallized, by applying the laser annealing of the present invention, and ensures enough reliability. The liquid crystal display device can be used as a display portion for an electronic appliance in various kinds.

Incidentally, this embodiment can be freely combined with Embodiments 1 to 6.

Embodiment 8

This embodiment explains an example of a light-emitting device manufactured by using the present invention. Though there is no description about the present invention in this embodiment. the present invention may be applied to this embodiment, because this embodiment uses the active matrix substrate formed in Embodiment 6. In this specification, the light-emitting device refers, generally, to the display panel having light-emitting elements formed on a substrate sealed between the substrate and a cover member, and the display module having an IC mounted on the display panel. Incidentally the light emitting element has a layer including an organic compound that electroluminescence caused is obtained by applying an electric field (light-emitting layer), an anode and a cathode. Meanwhile, the electroluminescence in organic compound includes the light emission (fluorescent light) upon returning from the singlet-excited state to the ground state and the light emission (phosphorous light) upon returning from the triplet-excited state to the ground state, including any or both of light emission.

All the layers that are provided between an anode and a cathode in a light emitting layer are an organic light emitting layer in this specification. Specifically, the organic light emitting layer includes a light emitting layer, a hole injection layer, an electron injection layer, a hole transporting layer, an electron transporting layer, etc. A basic structure of a light emitting element is a laminate of an anode, a light emitting layer, and a cathode layered in this order. The basic structure can be modified into a laminate of an anode, a hole injection layer, a light emitting layer, and a cathode layered in this order, or a laminate of an anode, a hole injection layer, a light emitting layer, an electron transporting layer, and a cathode layered in this order.

Figure 15:
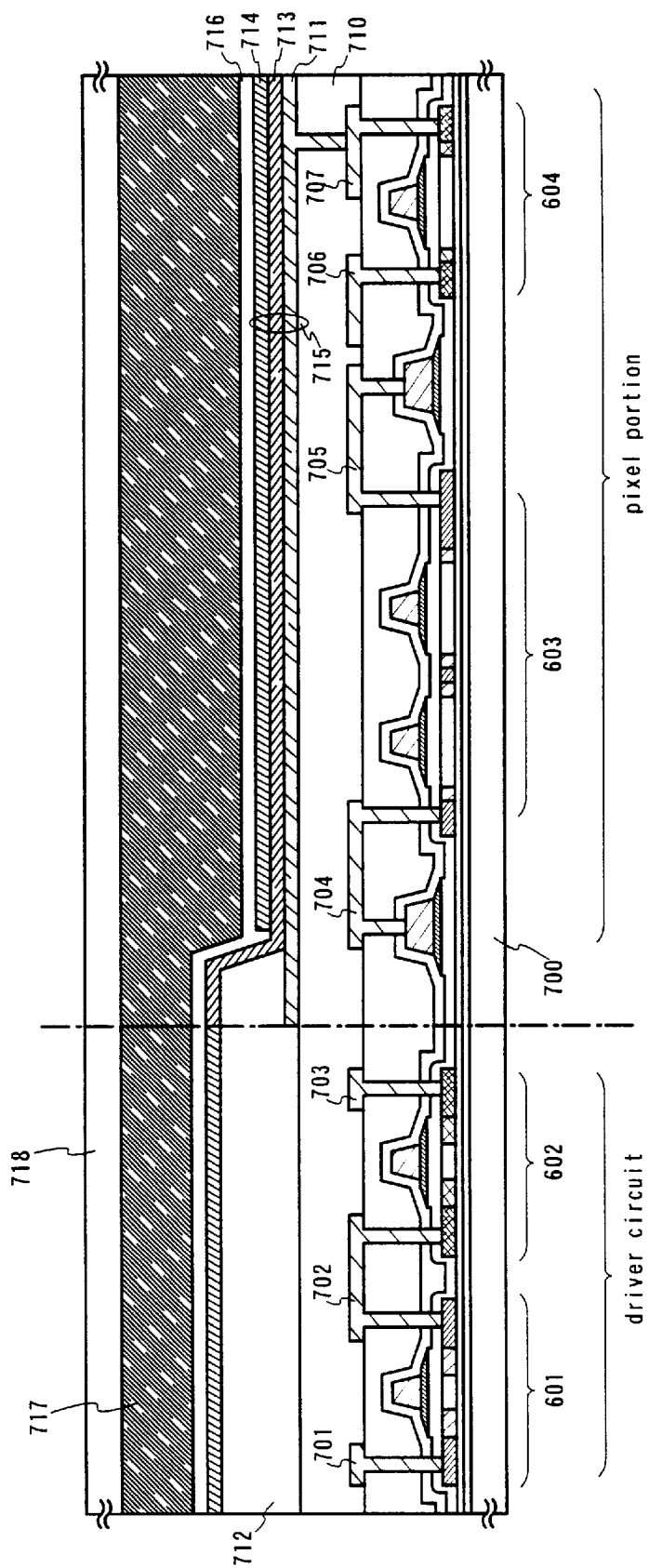
FIG. 15 is a cross sectional diagram of a driver circuit and a pixel portion of a light emitting device.

FIG. 15 is a sectional view of a light-emitting device of this embodiment. In FIG. 15, the switching TFT 603 provided on the substrate 700 is formed by using the n-channel TFT 503 of FIG. 12. Consequently, concerning the explanation of the structure, it is satisfactory to refer the explanation on the n-channel TFT 503.

Incidentally, although this example is of a double gate structure formed with two channel regions, it is possible to use a single gate structure formed with one channel region or a triple gate structure formed with three.

The driver circuit provided on the substrate 700 is formed by using the CMOS circuit of FIG. 12. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 12. Consequently, concerning the explanation of the structure, it is satisfactory to refer to the explanation on the p-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711 by being overlaid a pixel electrode 711 of the current control TFT.

Meanwhile, 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a resin planarizing film 710. A light-emitting layer to be formed later, because being extremely thin, possibly causes poor light emission due to the presence of a step. Accordingly, it is desired to provide planarization prior to forming a pixel electrode so that a light-emitting layer can be formed as planar as possible.

After forming the pixel electrode 711, a bank 712 is formed as shown in FIG. 15. The bank 712 may be formed by patterning an insulating film or organic resin film containing silicon having 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ $\Omega$m (preferably $1 \times 10^8$ to $1 \times 10^{10}$ $\Omega$m).

A light-emitting layer 713 is formed on the pixel electrode 711. Incidentally, although FIG. 15 shows only one pixel, this embodiment separately forms light-emitting layers correspondingly to the respective colors of R (red), G (green) and B (blue). Meanwhile, in this embodiment is formed a low molecular weight organic electroluminescent material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic electroluminescent material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this embodiment was shown the example in which a low molecular weight organic electroluminescent material is used for a light-emitting layer, it is possible to use a middle molecular weight organic electroluminescent material or high molecular weight organic electroluminescent material. In this specification, middle molecular weight organic electroluminescent material is made an organic light emitting material, which does not have the sublime, and which has 20 or less with 10 $\mu$m lengths chain molecular. As an example of using high molecular organic light emitting material, the laminated pad can be made 20 nm thick polythiophene (PEDOT) films is provided by spin coating method as a hole injection layer, and 100 nm thick paraphenylene-vinylene (PPV) films thereon. The light emitting wave length can be selected from red to blue by using $\pi$ conjugated system high molecular of PPV. The inorganic material such as a silicon carbide can be used as an electron transporting layer and an electron injection layer. Known materials can be used to these organic light emitting layer and the inorganic light emitting layer.

Next, a cathode 714 of a conductive film is provided on the light-emitting layer 713. In this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon nitride oxide film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light-emitting layer 713 low in heat resistance. Meanwhile, the DLC film, having a high blocking effect to oxygen, can suppress the light-emitting layer 713 from oxidizing. Consequently, prevented is the problem of oxidation in the light-emitting layer 713 during the following seal process.

Furthermore, a seal member 717 is provided on the passivation film 716 to bond a cover member 718. For the seal member 717 used may be an ultraviolet-ray-set resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 15. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, 602, a switching TFT (n-channel TFT) 603 and a current control TFT (n-channel TFT) 604 on the substrate 700.

Furthermore, as was explained using FIG. 15, by providing an impurity region overlapped with the gate electrode through an insulating film, it is possible to form an n-channel TFT resistive to the deterioration resulting from hot-carrier effect. Consequently, a reliable light-emitting device can be realized.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

Furthermore, explained is a light-emitting device of this embodiment having done the process up to sealing (or encapsulation) for protecting the light-emitting elements, using FIG. 16. Incidentally, the reference numerals used in FIG. 15 are cited as required.

FIG. 16A is a top view showing a state done up to sealing of the light-emitting elements while FIG. 16B is a sectional view taken on line C-C' in FIG. 16A. 801 designated by the dotted line is a source driver circuit. 806 a pixel portion and 807 a gate driver circuit. In addition, 901 is a cover member, 902 a first seal member and 903 a second seal member. An encapsulation material 907 is provided at the inside surrounded by the first seal member 902.

Incidentally, 904 is a wiring to transmit a signal to be inputted to a source driver circuit 801 and gate driver circuit 807, to receive a video signal or clock signal from an FPC (Flexible Print Circuit) 905 as an external input terminal. Incidentally, although only FPC is shown herein, the FPC may be attached with a printed wiring board (PWB). The light-emitting device in the description includes not only a light-emitting device main body but also such a device in the state attached with an FPC or PWB.

Next, explanation is made on the sectional structure, by using FIG. 16B. The pixel portion 806 and the gate driver circuit 807 are formed on the substrate 700. The pixel portion 806 is formed with a plurality of pixels each including a current control TFT 604 and a pixel electrode 711 electrically connected to a drain thereof. Meanwhile, the gate driver circuit 807 is formed using a CMOS circuit having a combination of an n-channel TFT 601 and a p-channel TFT 602 (see FIG. 14).

The pixel electrode 711 serves as an anode of a light-emitting element. Meanwhile, banks 712 are formed on the both ends of the pixel electrode 711. On the pixel electrode 711, a light-emitting layer 713 and a cathode 714 of a light-emitting element are formed.

The cathode 714 serves also as a wiring common to all the pixels and electrically connected to the FPC 905 by way of a connection wiring 904. Furthermore, all the elements included in the pixel portion 806 and gate driver circuit 807 are covered by the cathode 714 and passivation film 567.

Meanwhile, a cover member 901 is bonded by the first seal member 902. Incidentally, a resin-film spacer may be provided in order to secure spacing between the cover member 901 and the light-emitting elements. An encapsulation material 907 is filled inside the first seal member 902. Incidentally, the first seal member 902 and encapsulation material 907 preferably uses epoxy resin. Meanwhile, the first seal member 902 is preferably of a material to transmit water and oxygen to a possible less extent. Furthermore, the encapsulation material 907 may contain a substance having a hygroscopic effect or an antioxidant effect.

The encapsulation material 907 covering the light-emitting elements serves also as an adhesive to bond the cover member 901. Meanwhile, in this embodiment, as a material for the plastic substrate forming the cover member 901 can be used, FRP (Fiberglass-Reinforced Plastics), PVF (polyvinyl Fluoride), Myler, polyester or acryl.

Meanwhile, after bonding the cover member 901 by using an encapsulation material 907, a second seal member 903 is provided so as to cover the side surface (exposed surface) of the encapsulation material 907. For the second seal member 903 can be used the same material as the first seal member 902.

With the above structure, by encapsulating the light-emitting elements in the encapsulation material 907, the light-emitting elements can be completely shielded from the outside. It is possible to prevent the intrusion, from the external, of the substance, such as water or oxygen, which accelerates the deterioration in the light-emitting layer. Thus, a reliable light-emitting device can be obtained.

The liquid crystal display device manufactured as above uses semiconductor film, which is uniformly crystallized by applying the laser annealing of the present invention, and ensures enough reliability. The liquid crystal display device can be used as a display portion for an electronic appliance in various kinds.

Incidentally, this embodiment can be freely combined with Embodiments 1 to 6.

Embodiment 9

Various electronic apparatuses (active matrix type liquid crystal display device, active matrix type light emitting device and active matrix type EC display device) can be formed by applying the present invention. That is, the present invention can be applied to various electronic devices incorporating these electro-optical devices into the display portion.

As such electronic apparatus, there are pointed out a video camera, a digital camera, a projector, a head mount display (goggle type display), a car navigation system, a car stereo, a personal computer, a portable information terminal (mobile computer, portable telephone or electronic book) and the like. Examples of these are shown in FIGS. 17A–17F, 18A–18D, and 19A–19C.

FIG. 17A shows a personal computer including a main body 3001, an image input portion 3002, a display portion 3003 and a keyboard 3004. The present invention can be applied to the display portion 3003.

FIG. 17B shows a video camera including a main body 3101, a display portion 3102, a voice input portion 3103, operation switches 3104, a battery 3105 and an image receiving portion 3106. The present invention can be applied to the display portion 3102.

FIG. 17C shows a mobile computer including a main body 3201, a camera portion 3202, an image receiving portion 3203, an operation switch 3204 and a display portion 3205. The present invention can be applied to the display portion 3205.

FIG. 17D shows a goggle type display including a main body 3301, a display portion 3302 and an arm portion 3303. The present invention can be applied to the display portion 3302.

FIG. 17E shows a player using a record medium recorded with programs (hereinafter, referred to as record medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The present invention can be applied to the display portion 3402.

FIG. 17F shows a digital camera including a main body 3501, a display portion 3502, an eye contact portion 3503, operation switches 3504 and an image receiving portion (not illustrated) etc. The present invention can be applied to the display portion 3502.

Figure 18A:
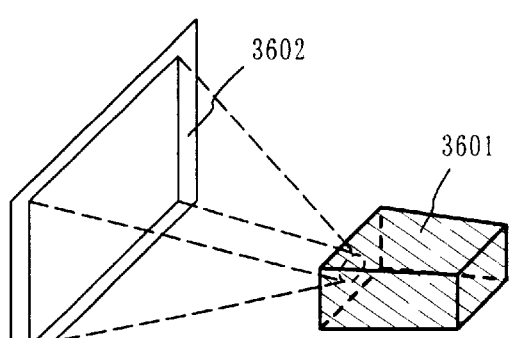
FIGS. 18A to 18D are diagrams illustrating examples of semiconductor devices.

FIG. 18A shows a front type projector including a projection apparatus 3601 and a screen 3602. The present invention can be applied to the liquid crystal module 3808 forming a part of the projection apparatus 3601.

Figure 18B:
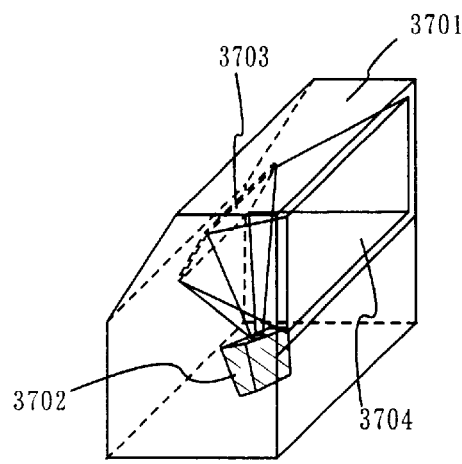

FIG. 18B shows a rear type projector including a main body 3701, a projection apparatus 3702, a mirror 3703 and a screen 3704. The present invention can be applied to the liquid crystal display device 3808 forming a part of the projection apparatus 3702 and other driver circuits.

Figure 18C:
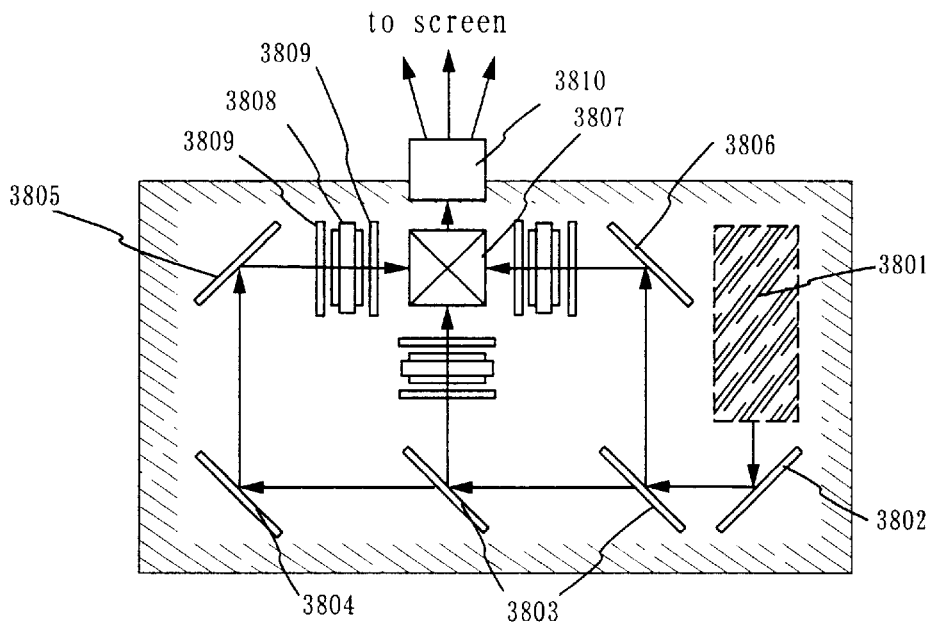

Further, FIG. 18C is a view showing an example of a structure of the projection apparatus 3601 and 3702 in FIG. 18A and FIG. 18B. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 18C.

Figure 18D:
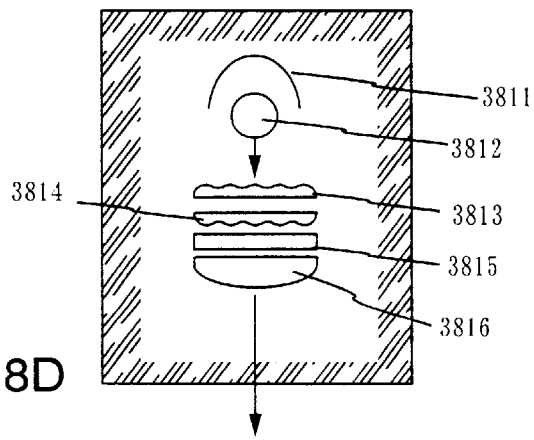

Further, FIG. 18D is a view showing an example of a structure of the light source optical system 3801 in FIG. 18C. According to this embodiment, the light source optical system 3801 is constituted by a reflector 3811, a light source 3812, lens arrays 3813 and 3814, a polarization conversion element 3815 and a focusing lens 3816. Further, the light source optical system shown in FIG. 18D is only an example and this example is not particularly limited thereto. For example, a person of executing this example may pertinently provide an optical system such as an optical lens, a film having a polarization function, a film for adjusting a phase difference or an IR film in the light source optical system.

However, according to the projectors shown in FIG. 18, there is shown a case of using a transmission type electro-optical device and an example of applying a reflection type electro-optical device or light emitting device are not illustrated.

Figure 19A:
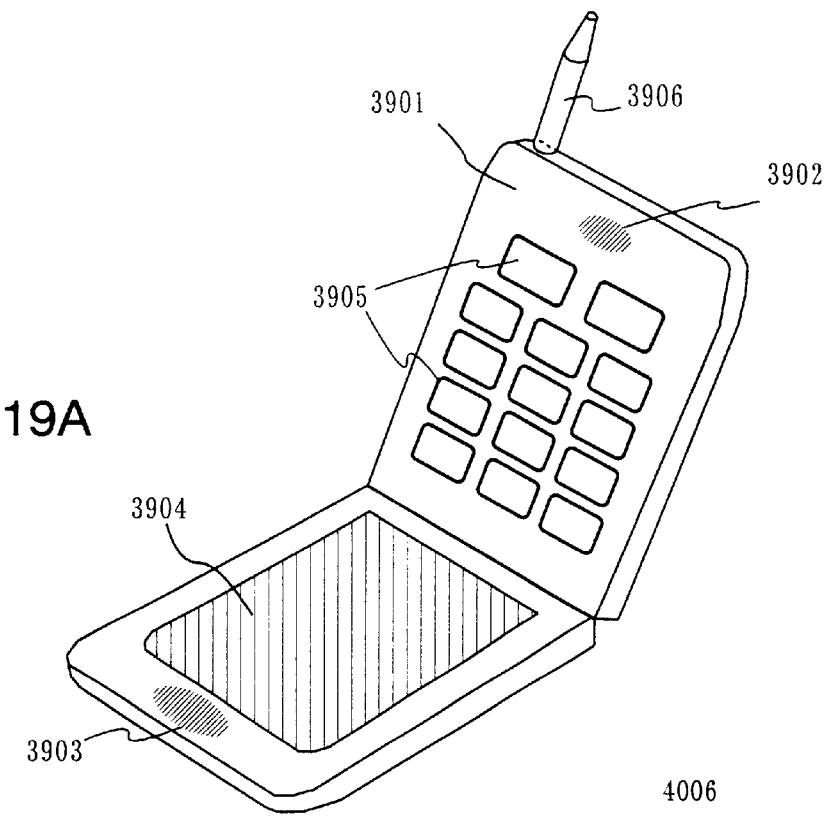
FIGS. 19A to 19C are diagrams illustrating examples of semiconductor devices.

FIG. 19A shows a portable telephone including a main body 3901, a sound output portion 3902, a sound input portion 3903, a display portion 3904, an operation switch 3905, and an antenna 3906. The present invention can be applied to display portion 3904.

Figure 19B:
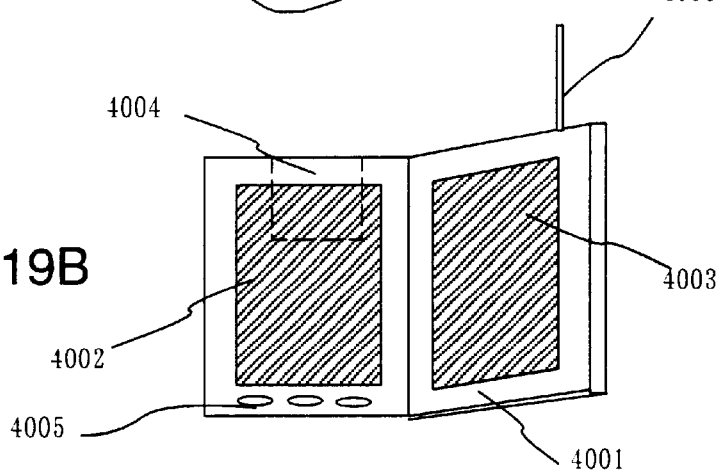

FIG. 19B shows a portable book (electronic book) including a main body 4001, display portions 4002, 4003, a record medium 4004, an operation switch 4005 and an antenna 4006. The present invention can be applied to display portions 4002 and 4003.

Figure 19C:
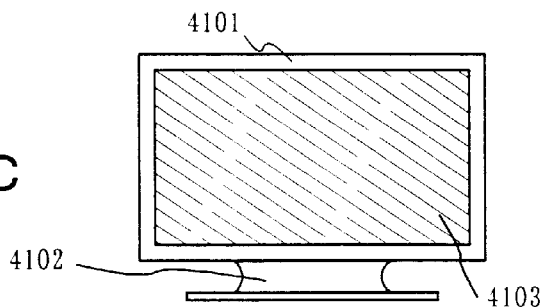

FIG. 19C shows a display including a main body 4101, a support base 4102 and a display portion 4103. The present invention can be applied to display portion 4103. The display according to the invention is advantageous particularly in the case of large screen formation and is advantageous in the display having a diagonal length of 10 inch or more (particularly, 30 inch or more).

As has been described, the range of applying the present invention is extremely wide and is applicable to electronic apparatus of all the fields. The electronic apparatus of the present invention can be implemented by freely combined with the structures in Embodiments 1 to 7 or Embodiment 8.

In accordance with the present invention, not only does it become possible to realize an optical system having a short optical path length when forming a longer linear shape beam by using a high output laser oscillator, but it becomes possible to achieve a laser irradiation apparatus having a small footprint.

Specifically, the optical path length of a long linear shape beam having a length that exceeds 300 mm can be made markedly shorter in accordance with the present invention.

In particular, the optical path length at the time of forming a linear shape beam by a conventional method becomes on the order of 10 m for cases in which the length of the linear shape beam is on the order of 1 m, and the footprint becomes very large. However, the optical path length can be kept to only half, 5 m, by applying the present invention. It is of course also possible to shorten the conventional optical path length of an optical system for forming a conventional linear shape beam, or that shorter than the conventional linear shape beam of the conventional optical system. In particular, the present invention is preferably applied to a process of the annealing for a semiconductor film. Semiconductor device manufacturing lines are normally located within a clean room having an extremely high cost per unit area, and therefore the reduction in the footprint has an enormous effect in reducing costs.

What is claimed is:

1. A laser irradiation stage comprising a surface on which an object to be irradiated by a beam is placed, wherein the beam is expanded in a single direction, and wherein the surface has a curvature in a direction parallel to the single direction.

2. A laser irradiation stage according to claim 1, wherein:

the curvature is provided in a negative direction with respect to the direction at which the beam advances.

3. A laser irradiation optical system, comprising:

a first means for expanding a beam in one direction; and a second means for providing an object to be irradiated by the beam expanded in the one direction with an irradiation surface for the beam expanded in the one direction;

wherein:
      the irradiation surface has a curvature in a direction parallel to the one direction, and
      the second means comprises a first surface on which the object to be irradiated by the beam expanded in the one direction is placed, the first surface having the curvature in the direction parallel to the one direction.

4. A laser irradiation optical system, comprising:

a first means for expanding a beam in a first direction;

a second means for condensing light from the beam in a second direction orthogonal to the first direction; and a third means for providing an object to be irradiated the beam expanded in the first direction and condensed in the second direction with an irradiation surface for the beam expanded in the first direction and condensed in the second direction;

wherein:
      the irradiation surface has a curvature in a direction parallel to the first direction; and
      the third means comprises a first surface on which the object to be irradiated the beam expanded in the first direction and condensed in the second direction is placed, the first surface having the curvature in the direction parallel to the first direction.

5. A laser irradiation optical system according to claims 4, wherein the first means makes the energy distribution of the beam uniform in the first direction.

6. A laser irradiation optical system according to claims 4, wherein the second means makes the energy distribution of the beam uniform in the second direction.

7. The laser irradiation optical system according to claim 3, wherein the first means contains a cylindrical lens array or a cylindrical lens.

8. The laser irradiation optical system according to claim 4, wherein the first means contains a cylindrical lens array or a cylindrical lens.

9. The laser irradiation optical system according to claim 4, wherein the second means contains a cylindrical lens array or a cylindrical lens.

10. The laser irradiation optical system according to claim 3, wherein the curvature is provided in a negative direction with respect to the direction at which the beam advances.

11. The laser irradiation optical system according to claim 4, wherein the curvature is provided in a negative direction with respect to the direction at which the beam advances.

12. A laser irradiation apparatus comprising:
a laser oscillator;
a first means for expanding a laser beam emitted from the laser oscillator in a first direction;
a second means for condensing the laser beam in a second direction that is orthogonal to the first direction; and
a third means for providing an object to be irradiated by the laser beam expanded in the first direction and condensed in the second direction with a laser beam irradiation surface and moving the irradiation surface in the second direction, relative to the laser beam;
wherein:
the laser beam irradiation surface has a curvature in a direction parallel to the first direction, and
the third means comprises a first surface on which the object to be irradiated by the laser beam expanded in the first direction and condensed in the second direction is placed, the first surface having the curvature in the direction parallel to the first direction.

13. A laser irradiation apparatus according to claim 12, wherein the first means makes the energy distribution of the laser beam uniform in the first direction.

14. A laser irradiation apparatus according to claim 12, wherein the second means makes the energy distribution of the laser beam uniform in the second direction.

15. A laser irradiation apparatus according to claim 12, wherein the first means contains a cylindrical lens array or a cylindrical lens.

16. A laser irradiation apparatus according to claim 12, wherein the second means contains a cylindrical lens array or a cylindrical lens.

17. A laser irradiation apparatus according to claim 12, wherein the laser oscillator is an excimer laser, a YAG laser, a $YVO_4$ laser, a YLF laser, a $YAlO_3$ laser, or a glass laser.

18. A laser irradiation apparatus according to claim 12, wherein the curvature is provided in a negative direction with respect to the direction at which the laser beam advances.

19. A laser irradiation method comprising:
expanding a laser beam emitted from a laser oscillator in a first direction;
condensing the laser beam in a second direction that is orthogonal to the first direction; and
irradiating the laser beam on an object on a surface while moving relative to the object in the second direction;
wherein:
the object has a curvature in a direction parallel to the first direction, and
the surface has the curvature in the direction parallel to the first direction.

20. A laser irradiation method according to claim 19, the energy distribution of the laser beam is made uniform in the first direction while expanding the laser beam.

21. A laser irradiation method according to claim 19, the energy distribution of the laser beam is made uniform in the second direction while condensing the laser beam.

22. A laser irradiation method according to claim 19, wherein:
the laser oscillator is an excimer laser, a YAG laser, a $YVO_4$ laser, a YLF laser, a $YAlO_3$ laser, or a glass laser.

23. A laser irradiation method according to claim 19, wherein:
the curvature is provided in a negative direction with respect to the direction at which the laser beam advances.

24. A method of manufacturing a semiconductor device, comprising:
expanding a laser beam emitted from a laser oscillator in a first direction;
condensing the laser beam in a second direction that is orthogonal to the first direction; and
annealing a semiconductor film placed on a surface by irradiating the laser beam onto the semiconductor film while moving relative to the semiconductor film in the second direction;
wherein:
wherein the semiconductor film has a curvature in a direction parallel to the first direction, and
the surface has the curvature in the direction parallel to the first direction.

25. A method of manufacturing a semiconductor device according to claim 24, wherein the energy distribution of the laser beam is made uniform in the first direction while expanding the laser beam.

26. A method of manufacturing a semiconductor device according to claim 24, wherein the energy distribution of the laser beam is made uniform in the second direction while condensing the laser beam.

27. A method of manufacturing a semiconductor device according to claim 24, wherein:
the laser oscillator is an excimer laser, a YAG laser, a $YVO_4$ laser, a YLF laser, a $YAlO_3$ laser, or a glass laser.

28. A method of manufacturing a semiconductor device according to claim 24, wherein:
the curvature is provided in a negative direction with respect to the direction at which the laser beam advances.

29. A method of manufacturing a semiconductor device according to claim 24, wherein the semiconductor device is a device selected from the group consisting of a personal computer, a video camera, a mobile computer, a goggle type display, a DVD player, a CD player, a front type projector, a rear type projector, a portable telephone and a portable book.

* * * * *